US010249820B2

(12) United States Patent
Lee et al.

(10) Patent No.: US 10,249,820 B2
(45) Date of Patent: Apr. 2, 2019

(54) SEMICONDUCTOR DEVICES AND METHODS OF MANUFACTURING THE SAME

(71) Applicant: SAMSUNG ELECTRONICS CO., LTD., Suwon-si, Gyeonggi-do (KR)

(72) Inventors: Kwang-Woo Lee, Hwaseong-si (KR); Dae-Hwan Kang, Seoul (KR); Gwan-Hyeob Koh, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/366,574

(22) Filed: Dec. 1, 2016

(65) Prior Publication Data

US 2017/0271592 A1    Sep. 21, 2017

(30) Foreign Application Priority Data

Mar. 15, 2016   (KR) .................... 10-2016-0030824

(51) Int. Cl.
*H01L 27/24*   (2006.01)
*H01L 45/00*   (2006.01)

(52) U.S. Cl.
CPC ...... *H01L 45/1675* (2013.01); *H01L 27/2427* (2013.01); *H01L 27/2481* (2013.01);
(Continued)

(58) Field of Classification Search
CPC ... H01L 45/16; H01L 45/167; H01L 45/1675; H01L 45/065; H01L 45/1233;
(Continued)

(56) References Cited

U.S. PATENT DOCUMENTS

| 6,707,087 B2 | 3/2004 | Fricke et al. |
| 7,351,992 B2 | 4/2008 | Scheuerlein |
| 7,534,625 B2 | 5/2009 | Karpov et al. |

(Continued)

FOREIGN PATENT DOCUMENTS

KR    10-1022580    3/2011

*Primary Examiner* — Fazli Erdem
(74) *Attorney, Agent, or Firm* — F. Chau & Associates, LLC

(57) ABSTRACT

The semiconductor device includes a plurality of first conductive patterns on a substrate, a first selection pattern on each of the plurality of first conductive patterns, a first structure on the first selection pattern, a plurality of second conductive patterns on the first structures, a second selection pattern on each of the plurality of second conductive patterns, a second structure on the second selection pattern, and a plurality of third conductive patterns on the second structures. Each of the plurality of first conductive patterns may extend in a first direction. The first structure may include a first variable resistance pattern and a first heating electrode. The first variable resistance pattern and the first heating electrode may contact each other to have a first contact area therebetween. Each of the plurality of second conductive patterns may extend in a second direction crossing the first direction. The second structure may include a second variable resistance pattern and a second heating electrode. The second variable resistance pattern and the second heating electrode may contact each other to have a second contact area therebetween, and the second contact area may be different from the first contact area.

20 Claims, 29 Drawing Sheets

(52) U.S. Cl.
CPC .......... *H01L 45/065* (2013.01); *H01L 45/126* (2013.01); *H01L 45/1233* (2013.01); *H01L 45/144* (2013.01)

(58) Field of Classification Search
CPC . H01L 45/126; H01L 45/144; H01L 27/2427; H01L 27/2481
See application file for complete search history.

(56) References Cited

U.S. PATENT DOCUMENTS

| | | | |
|---|---|---|---|
| 8,102,699 B2 | 1/2012 | Toda | |
| 8,440,991 B2 | 5/2013 | Park et al. | |
| 8,853,660 B2 | 10/2014 | Han et al. | |
| 2006/0157683 A1* | 7/2006 | Scheuerlein | H01L 27/2409 257/4 |
| 2006/0158928 A1* | 7/2006 | Pellizzer | H01L 27/2463 365/163 |
| 2007/0278538 A1* | 12/2007 | Chao | G11C 11/5678 257/248 |
| 2009/0267047 A1 | 10/2009 | Sasago et al. | |
| 2010/0072450 A1* | 3/2010 | Son | H01L 27/2409 257/4 |
| 2010/0136742 A1* | 6/2010 | Pellizzer | H01L 27/2427 438/102 |
| 2010/0327251 A1* | 12/2010 | Park | H01L 27/2409 257/2 |
| 2012/0217463 A1* | 8/2012 | Hwang | H01L 45/126 257/4 |
| 2013/0146833 A1* | 6/2013 | Russo | H01L 45/06 257/5 |
| 2015/0243708 A1 | 8/2015 | Ravasio et al. | |
| 2015/0280118 A1 | 10/2015 | Lee et al. | |
| 2017/0117328 A1* | 4/2017 | Terai | H01L 27/2481 |
| 2017/0200768 A1* | 7/2017 | Park | H01L 27/2481 |
| 2017/0213870 A1* | 7/2017 | Sim | H01L 27/2481 |
| 2017/0243923 A1* | 8/2017 | Jeong | G11C 13/0004 |

* cited by examiner

SEMICONDUCTOR DEVICES AND METHODS OF MANUFACTURING THE SAME

CROSS-REFERENCE TO RELATED APPLICATION

This application claims priority under 35 USC § 119 to Korean Patent Application No. 10-2016-0030824, filed on Mar. 15, 2016 in the Korean Intellectual Property Office (KIPO), the contents of which are herein incorporated by reference in their entirety.

TECHNICAL FIELD

Example embodiments relate to a memory device and a method of manufacturing the same, and more particularly, relate to a memory device having stacked cross-point array structures and methods of manufacturing the same.

DISCUSSION OF RELATED ART

As memory devices are highly integrated, variable resistance memory devices having a three-dimensional (3D) vertically stacked cross-point array structure in which a memory cell is disposed at a cross point between two electrodes crossing each other have been manufactured. However, electrical characteristics, such as a reset current, a reset voltage, etc., of the stacked memory cells may not be the same as each other. For example, the memory device may include first memory cells formed at a first level and second memory cells formed at a second level. Each of the first and second memory cells may include two or more conductive layers which may be formed of different materials, and may have a heterojunction structure. The currents passing through the junctions of these dissimilar materials for the first and second memory cells may be in different direction. Thus, the Peltier effect may differently occur in the first and second memory cells, so that reset currents of the first and second cell structures may be different from each other.

SUMMARY

Example embodiments of the present inventive concept provide a semiconductor device including vertically stacked cells, and a method of manufacturing the same.

According to an example embodiment of the present inventive concept, there is provided a semiconductor device. The semiconductor device includes a plurality of first conductive patterns on a substrate, a first selection pattern on each of the plurality of first conductive patterns, a first structure on the first selection pattern, a plurality of second conductive patterns on the first structures, a second selection pattern on each of the plurality of second conductive patterns, a second structure on the second selection pattern, and a plurality of third conductive patterns on the second structures. Each of the plurality first conductive patterns may extend in a first direction. The first structure may include a first variable resistance pattern and a first heating electrode. The first variable resistance pattern and the first heating electrode may contact each other to have a first contact area therebetween. Each of the plurality of second conductive patterns may extend in a second direction crossing the first direction. The second structure may include a second variable resistance pattern and a second heating electrode. The second variable resistance pattern and the second heating electrode may contact each other to have a second contact area therebetween, and the second contact area may be different from the first contact area.

According to an example embodiment of the present inventive concept, there is provided a semiconductor device. The semiconductor device includes a plurality of first conductive patterns on a substrate, a first selection pattern on each of the plurality of first conductive patterns, a first structure on the first selection pattern, a plurality of second conductive patterns on the first structures, a second selection pattern on each of the plurality of second conductive patterns, a second structure on the second selection pattern, and a plurality of third conductive patterns on the second structures. Each of the plurality of first conductive patterns may extend in a first direction. The first structure may include a first variable resistance pattern and a first heating electrode. Each of the plurality of second conductive patterns may extend in a second direction crossing the first direction. The second structure may include a second variable resistance pattern and a second heating electrode. The second heating electrode may have a second resistance different from a first resistance of the first heating electrode.

According to an example embodiment of the present inventive concept, there is provided a semiconductor device. The semiconductor device includes a plurality of first conductive patterns on a substrate, a first cell structure on each of the plurality of first conductive patterns, a plurality of second conductive patterns on the first cell structures, a second cell structure on each of the plurality of second conductive patterns, and a plurality of third conductive patterns on the second cell structures. Each of the plurality of first conductive patterns may extend in a first direction. The first cell structure may include a first selection pattern, a first variable resistance pattern and a first heating electrode. Each of the plurality of second conductive patterns may extend in a second direction crossing the first direction. The second cell structure may include a second selection pattern, a second variable resistance pattern and a second heating electrode. The first and second cell structures may be symmetric to each other with respect to the second conductive pattern.

According to an example embodiment of the present inventive concept, there is provided a method of manufacturing a semiconductor device. In the method, a plurality of first conductive patterns may be formed on a substrate. Each of the plurality of first conductive patterns may extend in a first direction. A first selection pattern may be formed on each of the plurality of first conductive patterns. A first structure may be formed on the first selection pattern. The first structure may include a first variable resistance pattern and a first heating electrode, and the first variable resistance pattern and the first heating electrode may contact each other to have a first contact area. A plurality of second conductive patterns may be formed on the first structures. Each of the plurality of second conductive patterns may extend in a second direction crossing the first direction. A second selection pattern may be formed on each of the plurality of second conductive patterns. A second structure may be formed on the second selection pattern. The second structure may include a second variable resistance pattern and a second heating electrode. The second variable resistance pattern and the second heating electrode may contact each other to have a second contact area different from the first contact area. A plurality of third conductive patterns may be formed on the second structures.

According to an example embodiment of the present inventive concept, there is provided a method of manufacturing a semiconductor device. In the method, a plurality of first conductive patterns may be formed on a substrate. Each of the plurality of first conductive patterns may extend in a first direction. A first selection pattern may be formed on each of the plurality of first conductive patterns. A first variable resistance pattern and a first heating electrode may be formed on the first selection pattern. The first heating electrode may have a first resistance. A plurality of second conductive patterns may be formed on the first heating electrodes. Each of the plurality of second conductive patterns may extend in a second direction crossing the first direction. A second selection pattern may be formed on each of the plurality of second conductive patterns. A second variable resistance pattern and a second heating electrode may be formed on the second selection pattern. The second heating electrode may have a second resistance different from the first resistance. A plurality of third conductive patterns may be formed on the second heating electrodes.

According to an example embodiment of the present inventive concept, there is provided a method of manufacturing a semiconductor device. In the method, a plurality of first conductive patterns may be formed on a substrate. Each of the plurality of first conductive patterns may extend in a first direction. A first cell structure may be formed on each of the plurality of first conductive patterns. The first cell structure may include a first selection pattern, a first variable resistance pattern and a first heating electrode. A plurality of second conductive patterns may be formed on the first cell structures. Each of the plurality of second conductive patterns may extend in a second direction crossing the first direction. A second cell structure may be formed on each of the plurality of second conductive patterns. The second cell structure may include a second selection pattern, a second variable resistance pattern and a second heating electrode. A plurality of third conductive patterns may be formed on the second cell structures. The first and second cell structures may be symmetric to each other with respect to the second conductive pattern.

According to an example embodiment of the present inventive concept, there is provided a semiconductor device. The memory device includes a plurality of first conductive patterns on a substrate, a first selection pattern on each of the plurality of first conductive patterns, a first structure on the first selection pattern, a plurality of second conductive patterns on the first structures, a second selection pattern on each of the plurality of second conductive patterns, a second structure on the second selection pattern, and a plurality of third conductive patterns on the second structures. Each of the plurality first conductive patterns may extend in a first direction. The first structure may include a first variable resistance pattern and a first heating electrode contacting the first variable resistance pattern. Each of the plurality of second conductive patterns may extend in a second direction crossing the first direction. The second structure may include a second variable resistance pattern and a second heating electrode contacting the second variable resistance pattern. The first structure may include a first spacer having a first thickness and surrounding sidewalls of the first variable resistance pattern and the first heating electrode, the second structure may include a second spacer having a second thickness different from the first thickness and surrounding sidewalls of the second variable resistance pattern and the second heating electrode, or both the first structure may include the first spacer and the second structure may include the second spacer. A width of the first structure may be substantially the same as a width of the second structure.

According to example embodiments of the present inventive concept, in the memory device, electrical characteristics of the upper and lower cell structures may be uniform. Thus, the memory device may have good electrical characteristics.

BRIEF DESCRIPTION OF THE DRAWINGS

Example embodiments of the present inventive concept will be more clearly understood from the following detailed description taken in conjunction with the accompanying drawings in which.

Figure 1:
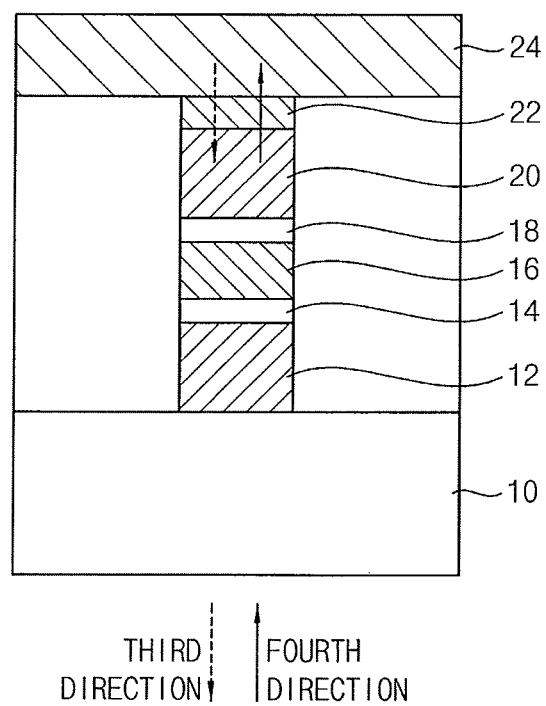
FIG. 1 is a cross-sectional view illustrating a variable resistance memory device in accordance with an example embodiment of the present inventive concept.

Since the drawings in FIGS. 1-35 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Figure 2:
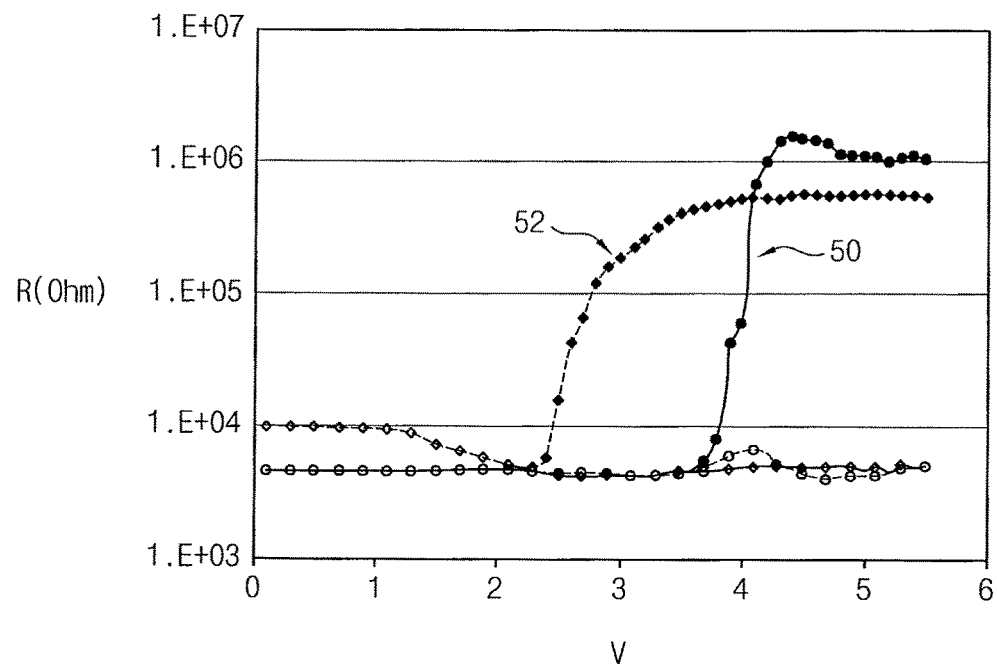
FIG. 2 is a graph showing a relationship between resistance and voltage according to directions of currents flowing in the variable resistance memory device.
Figure 3:
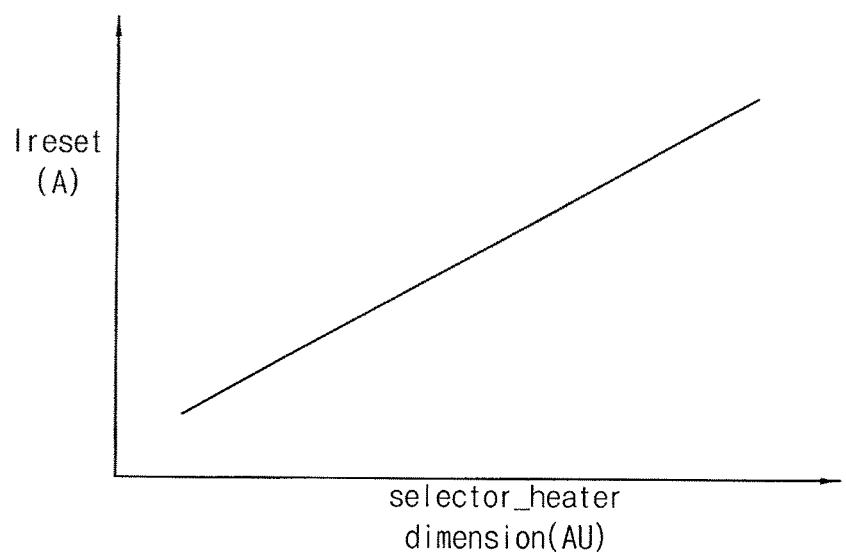
FIG. 3 is a graph showing a relationship between a contact area of a variable resistance pattern and a heating electrode and a reset current in the variable resistance memory device.

FIG. 1 is a cross-sectional view illustrating a variable resistance memory device in accordance with an example embodiment of the present inventive concept. FIG. 2 is a graph showing a relationship between resistance and voltage according to directions of currents flowing in the variable resistance memory device. FIG. 3 is a graph showing a relationship between a contact area of a variable resistance pattern and a heating electrode and a reset current in the variable resistance memory device.

Referring to FIG. 1, the variable resistance memory device may include a first conductive pattern 12 and a second conductive pattern 24 on a substrate 10, and the first and second conductive patterns 12 and 24 may cross each other in a plan view. The first and second conductive patterns 12 and 24 may be spaced apart from each other in a vertical direction on the substrate 10. A cell structure including a selection pattern 16, a variable resistance pattern 20 and a heating electrode 22 sequentially stacked may be formed between the first and second conductive patterns 12 and 24. In an example embodiment of the present inventive concept, a first electrode 14 may be further formed beneath a lower surface of the selection pattern 16, and a second electrode 18 may be further formed on an upper surface of the selection pattern 16.

The variable resistance pattern 20 and the heating electrode 22 may include materials different from each other, and may have a heterojunction structure. Thus, a Peltier effect may differently occur according to the direction of currents between the variable resistance pattern 20 and the heating electrode 22. Peltier effect relates to an effect that junctions of dissimilar materials are heated or cooled, depending upon the direction of an electric current passing across them. That is, according to the direction of currents between the variable resistance pattern 20 and the heating electrode 22, the variable resistance pattern 20 and the heating electrode 22 may be differently heated, and thus an operational characteristic of the cell structure may be varied.

When currents flow from the heating electrode 22 to the variable resistance pattern 20 in the cell structure, the direction of the currents may be referred to as a third direction. When currents flow from the variable resistance pattern 20 to the heating electrode 22 in the cell structure, the direction of the currents may be referred to as a fourth direction.

In FIG. 2, a reference numeral 50 is a graph showing the relationship between resistance and voltage when the currents flow in the third direction. A reference numeral 52 is a graph showing the relationship between resistance and voltage when the currents flow in the fourth direction.

When the currents flow in the third direction, the cell structure may have a first reset voltage. When the currents flow in the fourth direction, the cell structure may have a second reset voltage which may be lower than the first reset voltage. Thus, the cell structure may have a first reset current when the currents flow in the third direction, which may be greater than a second reset current of the cell structure when the currents flow in the fourth direction.

Referring to FIG. 3, as the contact area between the variable resistance pattern 20 and the heating electrode 22 increases, the reset current may increase. In FIG. 3, the Y axis represents the reset current (Ireset) with ampere unit (A), and the X axis represents the contact area between the variable resistance pattern and the heating electrode (selector_heater dimension) with arbitrary unit (AU). Thus, to reduce the reset current, the contact area between the variable resistance pattern 20 and the heating electrode 22 may have to be decreased.

Figure 4A:
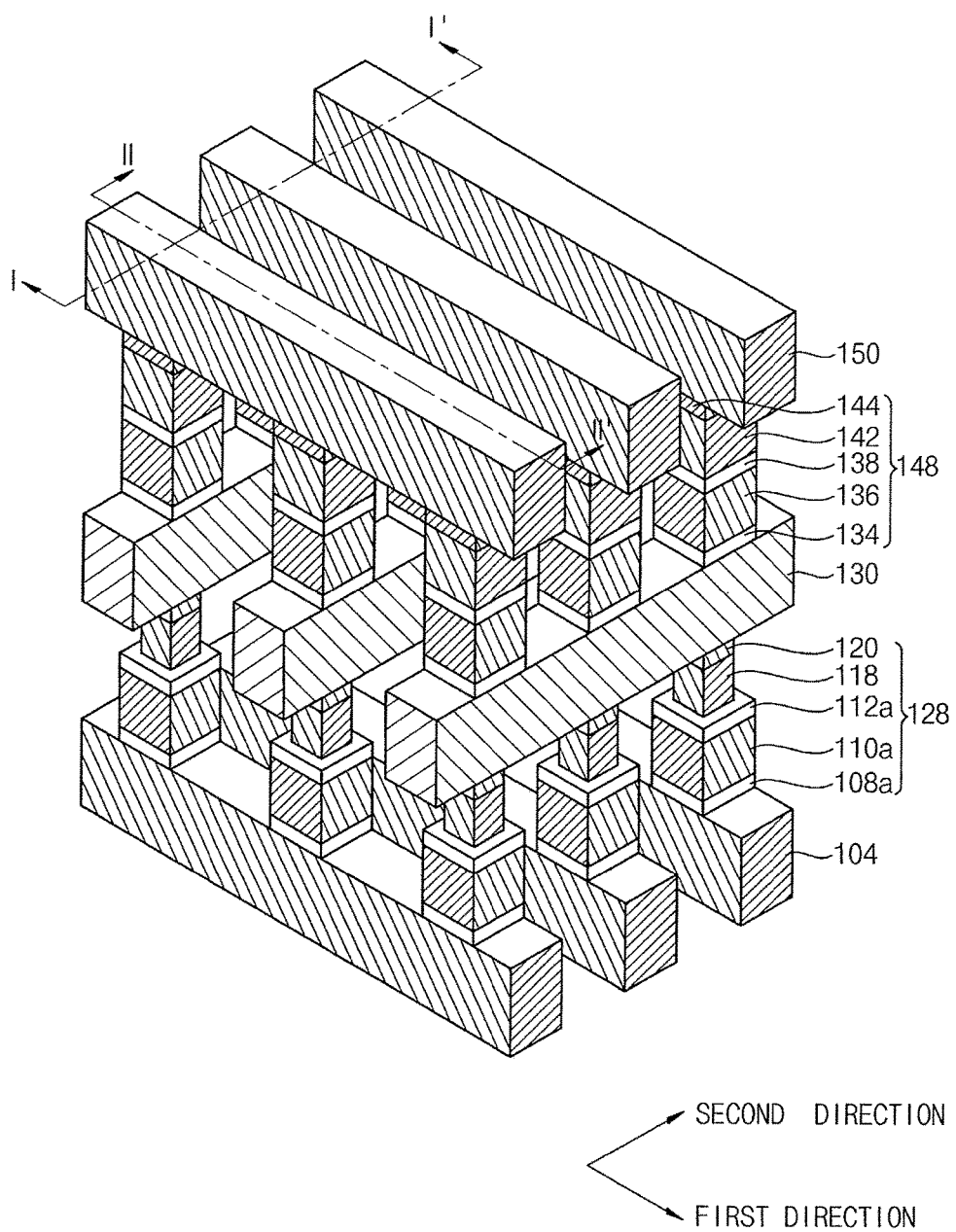
FIGS. 4A and 4B are a perspective view and a cross-sectional view, respectively, illustrating a variable resistance memory device in accordance with an example embodiment of the present inventive concept.
Figure 4B:
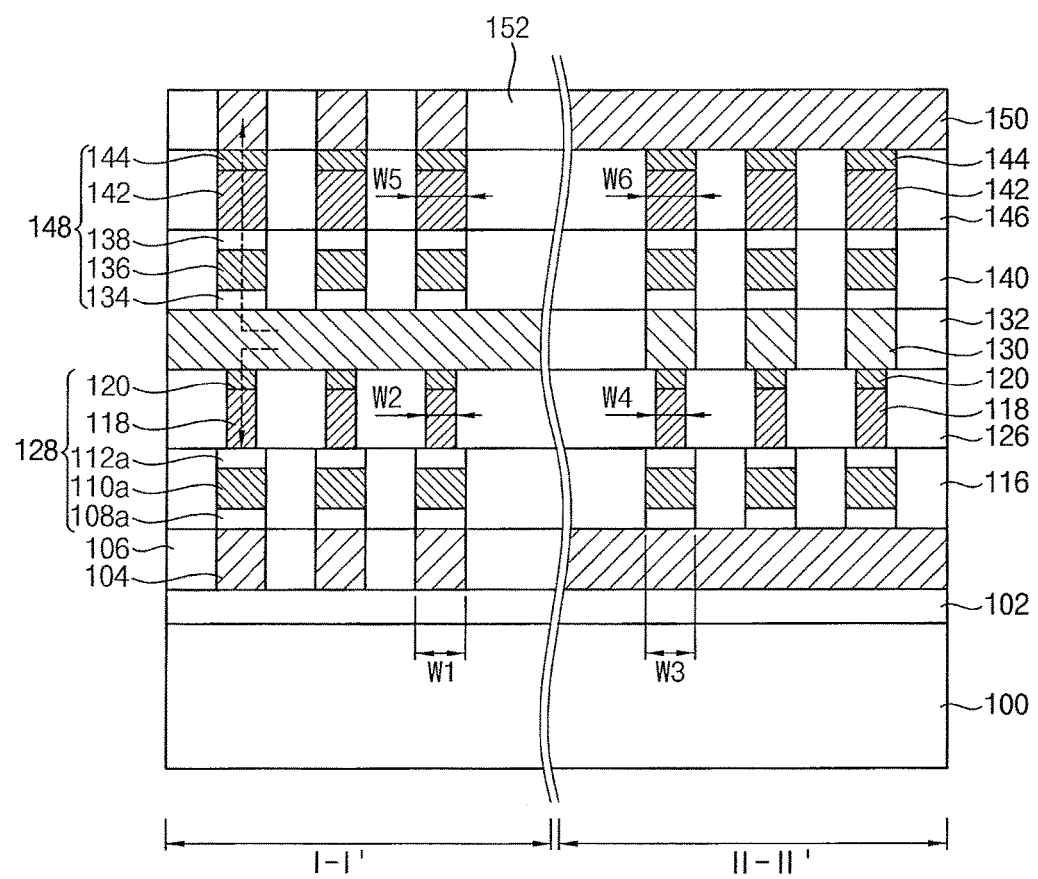
Figure 4C:
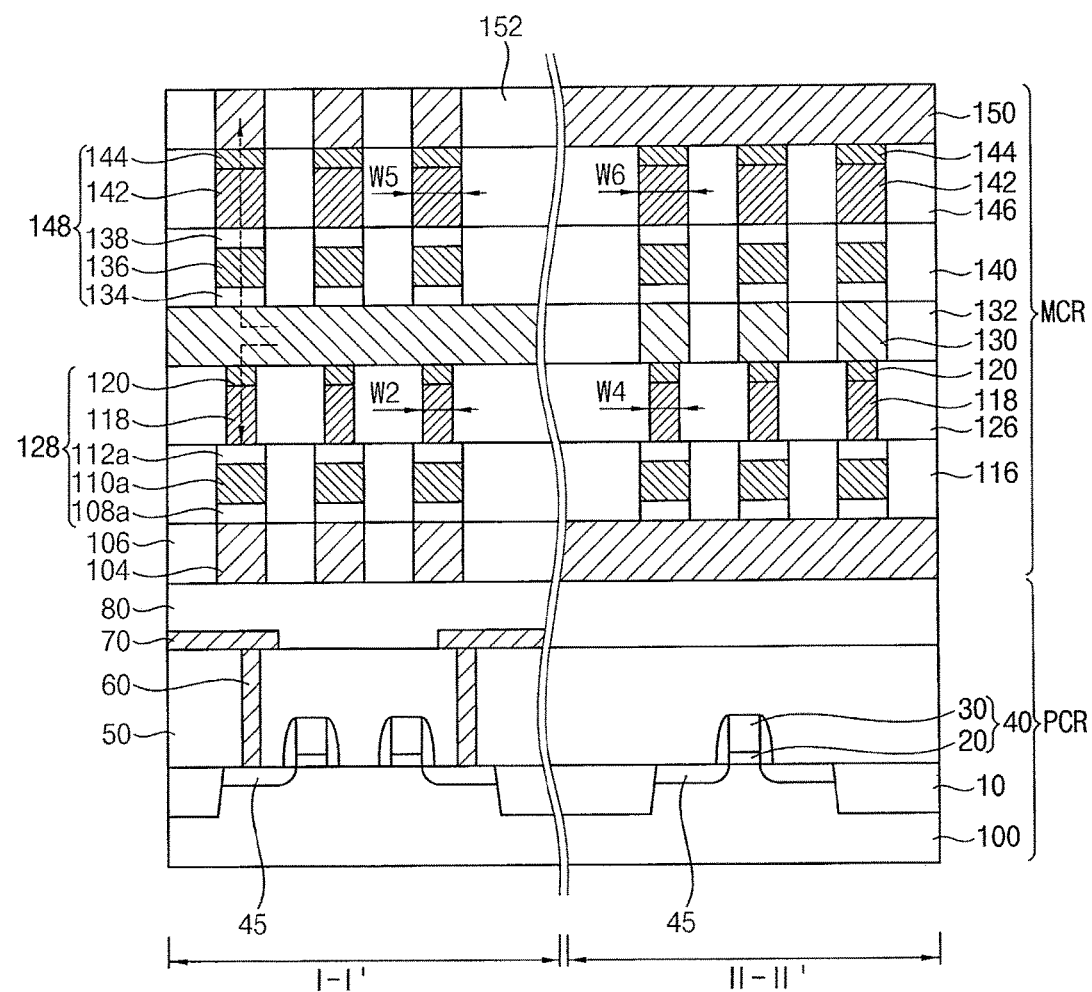
FIG. 4C is a cross-sectional view illustrating a variable resistance memory device in accordance with an example embodiment of the present inventive concept.

FIGS. 4A and 4B are a perspective view and a cross-sectional view, respectively, illustrating a variable resistance memory device in accordance with an example embodiment of the present inventive concept. FIG. 4C is a cross-sectional view illustrating a variable resistance memory device in accordance with an example embodiment of the present inventive concept different from the example embodiment for FIGS. 4A and 4B.

FIG. 4B includes cross-sectional views taken along lines I-I' and II-II' of FIG. 4A, respectively.

A first direction and a second direction may be substantially parallel to a top surface of a substrate, and may be substantially perpendicular to each other. Also, a third direction and a fourth direction may be substantially perpendicular to the top surface of the substrate. The third direction is a direction from a heating electrode toward a variable resistance pattern, and the fourth direction is a direction from the variable resistance pattern toward the heating electrode as illustrated in FIG. 1. Hereinafter, the definitions of the first to fourth directions may be the same in all figures.

Referring to FIGS. 4A and 4B, the variable resistance memory device may include a first conductive pattern 104, a first cell structure 128, a second conductive pattern 130, a second cell structure 148 and a third conductive pattern 150.

The first cell structure 128 may include a first selection pattern 110a, a first variable resistance pattern 118 and a first heating electrode 120. The first variable resistance pattern 118 may contact the first heating electrode 120.

The second cell structure 148 may include a second selection pattern 136, a second variable resistance pattern 142 and a second heating electrode 144. The first and second cell structures 128 and 148 may have substantially the same multi-layer stacked structure. However, a first contact area between the first variable resistance pattern 118 and the first heating electrode 120 and a second contact area between the second variable pattern 142 and the second heating electrode 144 may be different from each other.

The substrate 100 may include, for example, silicon, germanium, silicon-germanium, or III-V compounds (e.g., GaP, GaAs, GaSb, InSb, InAs, InP etc.). In an example embodiment of the present inventive concept, the substrate 100 may be a silicon-on-insulator (SOI) substrate, or a germanium-on-insulator (GOI) substrate. In an example embodiment of the present inventive concept, an upper surface of the substrate 100 may have an insulator.

In an example embodiment of the present inventive concept, lower elements (e.g., transistors) and an insulation layer 102 covering the lower elements may be formed on the substrate 100. For example, the lower elements may form peripheral circuits. The insulation layer 102 may include silicon oxide.

The first conductive pattern 104 may extend in the first direction, and a plurality of first conductive patterns 104 may be arranged and spaced apart in the second direction. In an example embodiment of the present inventive concept, the first conductive pattern 104 may be formed on the insulation layer 102.

The first conductive pattern 104 may include, for example, a metal or a metal nitride. In an example embodiment of the present inventive concept, the first conductive pattern 104 may include a first barrier pattern, a first metal pattern and a second barrier pattern sequentially stacked. The first and second barrier patterns may include a metal nitride, e.g., titanium nitride ($TiN_x$), tungsten nitride ($WN_x$), tantalum nitride ($TaN_x$), zirconium nitride ($ZrN_x$), etc., or a metal silicon nitride, e.g., titanium silicon nitride ($TiSiN_x$), tungsten silicon nitride ($WSiN_x$), tantalum silicon nitride ($TaSiN_x$), zirconium silicon nitride ($ZrSiN_x$), etc. The x added after N in the formulas of the above compounds may represent that the compositions of these compounds may be non-stoichiometric. The first metal pattern may include a metal, e.g., tungsten (W), platinum (Pt), palladium (Pd), rhodium (Rh), ruthenium (Ru), iridium (Ir), copper (Cu), aluminum (Al), titanium (Ti), tantalum (Ta), gold (Au), silver (Ag), zirconium (Zr), nickel (Ni), cobalt (Co), chromium (Cr), etc.

In an example embodiment of the present inventive concept, the first conductive pattern 104 may serve as a first word line of the variable resistance memory device.

In an example embodiment of the present inventive concept, the first cell structure 128 may have a pillar shape including the first selection pattern 110a, the first variable resistance pattern 118 and the first heating electrode 120 sequentially stacked. The first cell structure 128 may have various pillar shapes such as, for example, a tetragonal pillar, a circular pillar, an elliptical pillar, a polygonal pillar, etc. The first cell structure 128 may be formed on each of the first conductive patterns 104, and a plurality of first cell structures 128 may be spaced apart from each other on each of the first conductive patterns 104. The first cell structures 128 may be aligned with and spaced apart from each other in each of the first and second directions.

In an example embodiment of the present inventive concept, the first selection pattern 110a may have a first width W1 in the second direction. In an example embodiment of the present inventive concept, the first conductive pattern 104 may also have the first width W1 in the second direction, and thus, the width in the second direction of the first conductive pattern 104 may be substantially the same as the width in the second direction of the first selection pattern 110a.

In an example embodiment of the present inventive concept, a first electrode 108a may be further formed between the first selection pattern 110a and the first conductive pattern 104, and a second electrode 112a may be further formed between the first selection pattern 110a and the first variable resistance pattern 118. In this case, a first structure including the first electrode 108a, the first selection pattern 110a and the second electrode 112a sequentially stacked may have the first width W1 in the second direction.

In an example embodiment of the present inventive concept, a second structure including the first variable resistance pattern 118 and the first heating electrode 120 sequentially stacked may have a second width W2 in the second direction smaller than the first width W1.

The first structure may have a third width W3 in the first direction. The second structure may have a fourth width W4 in the first direction smaller than the third width W3.

A portion of the first variable resistance pattern 118 contacting the first heating electrode 120 may have a first contact area.

In an example embodiment of the present inventive concept, the first heating electrode 120 may include a metal nitride, e.g., titanium nitride ($TiN_y$), tungsten nitride ($WN_x$), tantalum nitride ($TaN_x$), zirconium nitride ($ZrN_x$), etc., or a metal silicon nitride, e.g., titanium silicon nitride ($TiSiN_x$), tungsten silicon nitride ($WSiN_x$), tantalum silicon nitride ($TaSiN_x$), zirconium silicon nitride ($ZrSiN_x$), etc.

In an example embodiment of the present inventive concept, the first and second electrodes 108a and 112a may include a metal or a metal nitride having an electrical resistance lower than an electrical resistance of the first heating electrode 120.

In an example embodiment of the present inventive concept, the first selection pattern 110a may include an Ovonic threshold switch (OTS) material. The OTS materials and phase-change materials (PCM) may be in the same class, but the OTS materials are usually frozen in the amorphous phase. In other words, the OTS materials do not undergo a crystallization transformation during switching and remain amorphous upon removing the applied voltage after switching. The first selection pattern 110a may remain in the amorphous state in a wider range of the temperature, as compared with the first variable resistance pattern 118. In the amorphous state, a resistance of the OTS material may be varied according to the temperature.

The first selection pattern 110a including the OTS material may serve as a switching element for selection of cells. The OTS material may include germanium (Ge), silicon (Si), indium (In), arsenic (As) and/or tellurium (Te). Also, the OTS material may further include selenium (Se) and/or sulfur (S). In addition, many other elements may also be incorporated in the composition of the OTS material, which include but are not limited to: antimony (Sb), Tin (Sn), phosphorus (P), nitrogen (N), zinc (Zn), Aluminum (Al), carbon (C), and lead (Pb).

The OTS material may include, e.g., AsTeGeSiIn, GeTe, SnTe, GeSe, SnSe, AsTeGeSiSbS, AsTeGeSiIP, AsTeGeSi, $As_2Te_3Ge$, $As_2Se_3Ge$, $As_{25}(Te_{90}Ge_{10})_{75}$, $Te_{40}As_{35}Si_{18}Ge_{6.75}In_{0.25}$, $Te_{28}As_{34.5}Ge_{15.5}S_{22}$, $Te_{39}As_{36}Si_{17}Ge_7P_1$, $As_{10}Te_{21}S_2Ge_{15}Se_{50}Sb_2$, $Si_5Te_{34}As_{28}Ge_{11}S_{21}Se_1$, AsTeGeSiSeNS, AsTeGeSiP, AsSe, AsGeSe, AsTeGeSe, ZnTe, GeTePb, GeSeTe, AlAsTe, SeAsGeC, SeTeGeSi, GeSbTeSe, GeBiTeSe, GeAsSbSe, GeAsBiTe, GeAsBiSe, $Ge_xSe_{1-x}$, etc. For $Ge_xSe_{1-x}$, x may be selected within a range of $0<x\leq0.5$. In an example embodiment of the present inventive concept, the first selection pattern 110a may include a diode, tunnel junction, a PNP diode or a bipolar junction transistor (BJT), mixed ionic-electronic conduction (MIEC), etc.

In an example embodiment of the present inventive concept, the first variable resistance pattern 118 may include a material of which a resistance may be changed by a phase change or a phase transition, for example, a PCM. In this case, the variable resistance memory device may be a phase-change random access memory (PRAM) device. The first variable resistance pattern 118 may include a chalcogenide-based material in which germanium (Ge), antimony (Sb) and/or tellurium (Te) are combined by a given ratio, and may be represented by Ge—Sb—Te (germanium-antimony-tellurium, GST) when all three elements are combined. Here, a chemical composition mark including hyphens (-) may represent a certain compound or an element included in a compound and may represent all chemical formula structures including the represented element and/or the certain compound. For example, Ge—Sb—Te may represent a material such as $Ge_2Sb_2Te_5$, $Ge_2Sb_2Te_7$, $Ge_1Sb_2Te_4$, $Ge_1Sb_4Te_7$, or the like. Similarly, for simplicity, GeSbTe may also represent all chemical formula structures including the represented three elements, Ge, Sb and Te.

The first variable resistance pattern 118 may include various phase change materials in addition to the above material Ge—Sb—Te. Compositions of the phase-change materials for the first variable resistance pattern 118 may contain mixtures of various elements which include, but are not limited to: germanium (Ge), antimony (Sb), tellurium (Te), indium (In), selenium (Se), Gallium (Ga), arsenic (As), aluminum (Al), bismuth (Bi), Tin (Sn), oxygen (O), sulfur (S), nitrogen (N), gold (Au), palladium (Pd), titanium (Ti), cobalt (Co), silver (Ag), and nickel (Ni).

In an example embodiment of the present inventive concept, the first variable resistance pattern 118 may include a material of which a resistance may be changed by a magnetic field or a spin transfer torque (STT). In this case, the variable resistance memory device may be a magnetic random access memory (MRAM) device. The first variable resistance pattern 118 may include a ferromagnetic material, e.g., iron (Fe), nickel (Ni), cobalt (Co), dysprosium (Dy), gadolinium (Gd), etc.

In an example embodiment of the present inventive concept, the first variable resistance pattern 118 may include, e.g., a transition metal oxide or a perovskite-based material. In this case, the variable resistance memory device may be a resistive random access memory (ReRAM) device. The transition metal oxide may include, for example, oxide of at least one metal of tantalum (Ta), zirconium (Zr), titanium (Ti), hafnium (Hf), manganese (Mn), yttrium (Y), nickel (Ni), cobalt (Co), zinc (Zn), niobium (Nb), copper (Cu), iron (Fe), and chromium (Cr).

The second conductive pattern 130 may extend in the second direction.

In an example embodiment of the present inventive concept, the first conductive pattern 104 may serve as a first word line, and the second conductive pattern 130 may serve as a common bit line that may be commonly used in the variable resistance memory device.

The second conductive pattern 130 may include a metal having a resistance lower than a resistance of the first heating electrode 120. The second conductive pattern 130 may include a metal, e.g., tungsten (W), platinum (Pt), palladium (Pd), rhodium (Rh), ruthenium (Ru), iridium (Ir), copper (Cu), aluminum (Al), titanium (Ti), tantalum (Ta), gold (Au), silver (Ag), zirconium (Zr), nickel (Ni), cobalt (Co), chromium (Cr), etc.

As described above, the first and second conductive patterns 104 and 130 may be disposed to cross each other. The first cell structure 128 may be formed at each crosspoint of the first and second conductive patterns 104 and 130.

Insulation patterns may be formed to fill a space between the first conductive patterns 104, a space between the first cell structures 128, and a space between the second conductive patterns 130.

In an example embodiment of the present inventive concept, a first insulation pattern 106 may be formed between the first conductive patterns 104, and a second insulation pattern 116 may be formed between the first selection patterns 110a. A third insulation pattern 126 may be formed between the second structures, and a fourth insulation pattern 132 may be formed between the second conductive patterns 130. The second insulation pattern 116 may be formed between the first structures.

In an example embodiment of the present inventive concept, the second cell structure 148 may have a pillar shape including a second selection pattern 136, a second variable resistance pattern 142 and a second heating electrode 144 sequentially stacked. The second cell structure 148 may have various pillar shapes such as, for example, a tetragonal pillar, a circular pillar, an elliptical pillar, a polygonal pillar, etc. The second cell structure 148 may be formed on each of the second conductive patterns 130, and a plurality of second cell structures 148 may be spaced apart from each other on each of the second conductive patterns 130. The second cell structures 148 may be aligned with and spaced apart from each other in each of the first and second directions.

In an example embodiment of the present inventive concept, a third electrode 134 may be further formed between the second selection pattern 136 and the second conductive pattern 130, and a fourth electrode 138 may be further formed between the second selection pattern 136 and the second variable resistance pattern 142.

In an example embodiment of the present inventive concept, the second selection pattern 136 may be substantially the same as the first selection pattern 110a. That is, the second selection pattern 136 may have the first width W1 in the second direction, and may have the third width W3 in the first direction. In an example embodiment of the present inventive concept, the second conductive pattern 130 may have the third width W3 in the first direction, and thus, the width in the first direction of the second conductive pattern 130 may be substantially the same as the width in the first direction of the second selection pattern 136. The second selection pattern 136 may include a material substantially the same as a material of the first selection pattern 110a, e.g., OTS material. A third structure may include the third electrode 134, the second selection pattern 136 and the fourth electrode 138 sequentially stacked, and may have the first width W1 in the second direction and the third width W3 in the first direction A fourth structure including the second variable resistance pattern 142 and the second heating electrode 144 sequentially stacked may have a fifth width W5 in the second direction greater than the second width W2. In an example embodiment of the present inventive concept, the fifth width W5 may be substantially the same as the first width W1.

The fourth structure may have a sixth width W6 in the first direction greater than the fourth width W4. In an example embodiment of the present inventive concept, the sixth width W6 may be substantially the same as the third width W3.

As described above, the fourth structure may have widths in the first and second directions greater than widths in the first and second directions of the second structure, respectively. Thus, a second contact area between the second variable resistance pattern 142 and the second heating electrode 144 may be greater than the first contact area.

The third conductive pattern 150 may extend in the first direction. The third conductive pattern 150 may overlap with the first conductive pattern 104.

In an example embodiment of the present inventive concept, the third conductive pattern 150 may serve as a second word line in the variable resistance memory device.

In an example embodiment of the present inventive concept, the third conductive pattern 150 may include a multi-layer stacked structure substantially the same as a multi-layer stacked structure of the first conductive pattern 104. In an example embodiment of the present inventive concept, the third conductive pattern 150 may include a third barrier pattern, a second metal pattern and a fourth barrier pattern stacked.

Insulation patterns may fill a space between the second cell structures 148 and a space between the third conductive patterns 150.

In an example embodiment of the present inventive concept, a fifth insulation pattern 140 may be formed between the second selection patterns 136, a sixth insulation pattern 146 may be formed between the fourth structures, and a seventh insulation pattern 152 may be formed between the third conductive patterns 150. The fifth insulation pattern 140 may be formed between the third structures.

In the variable resistance memory device, when a voltage is applied to the second conductive pattern 130 serving as the common bit line, a first current may flow into the first conductive pattern 104 through the first heating electrode 120, the first variable resistance pattern 118 and the first selection pattern 110a so that data may be written in each of the first cell structures 128. That is, the first current may flow in the third direction, i.e., a direction from a heating electrode toward a variable resistance pattern, during an operation of the first cell structure 128.

In the variable resistance memory device, when a voltage is applied to the second conductive pattern 130 serving as the common bit line, a second current may flow into the third conductive pattern 150 through the second selection pattern 136, the second variable resistance pattern 142 and the second heating electrode 144 so that data may be written in each of the second cell structures 148. That is, the second current may flow in the fourth direction, i.e., a direction from a variable resistance pattern toward a heating electrode, during an operation of the second cell structure 148, and thus directions of the first and second currents may be different from each other.

Even if the first and second cell structures 128 and 148 have substantially the same structure, reset currents of the first and second cell structures 128 and 148 may be different from each other. For example, the reset current of the first cell structure 128 may be higher than the reset current of the second cell structure 148. However, in an example embodiment of the present inventive concept, the first contact area of the first cell structure 128 may be smaller than the second contact area of the second cell structure 148, so that the reset current of the first cell structure 128 may be reduced.

As the first and second contact areas may be different from each other, a difference between reset currents of the first and second cell structures 128 and 148 may be eliminated or reduced by adjusting the difference between the first and second contact areas. In an example embodiment of the present inventive concept, reset currents of the first and second cell structures 128 and 148 may be substantially the same as each other.

In an example embodiment of the present inventive concept, the variable resistance memory device may have a cell over peripheral (COP) structure, which may include peripheral circuits and memory cells sequentially stacked on a substrate 100, as shown in FIG. 4C.

Referring to FIG. 4C, the variable resistance memory device may include a peripheral circuit region (PCR) and a memory cell region (MCR) sequentially stacked on the substrate 100. The substrate 100 may be divided into an active region and a field region by an isolation layer 10.

In an example embodiment of the present inventive concept, a gate structure 40, an impurity layer 45, a first contact plug 60 and a lower wiring pattern 70 may be formed in the peripheral circuit region. The first conductive pattern 104, the first cell structure 128, the second conductive pattern 130, the second cell structure 148 and the third conductive pattern 150 may be formed in the memory cell region.

The gate structure 40 may include a gate insulation pattern 20 and a gate electrode 30 sequentially stacked. The gate insulation pattern 20 may include, e.g., silicon nitride, a metal nitride, etc. The gate electrode 30 may include, e.g., doped polysilicon, a metal, a metal silicide, a metal nitride, etc. A gate spacer may be further formed on a sidewall of the gate structure 40.

The impurity layer 45 may be formed at an upper portion of the substrate 100 adjacent to the gate structure 40, and may be doped with n-type impurities or p-type impurities.

The gate structure 40 and the impurity layer 45 may form a transistor. For example, a negative-channel metal oxide semiconductor (NMOS) transistor may be defined by the gate structure 40 and the impurity layer 45 doped with n-type impurities, and a positive-channel metal oxide semiconductor (PMOS) transistor may be defined by the gate structure 40 and the impurity layer 45 doped with p-type impurities.

A first lower insulating interlayer 50 may be formed on the substrate 100 to cover the transistor, and may include an oxide, e.g., silicon oxide.

A first contact plug 60 formed in the first lower insulating interlayer 50 may contact an upper portion of the impurity layer 105. In an example embodiment of the present inventive concept, a plurality of first contact plugs 60 may be formed on a plurality of impurity layers 50, respectively.

The lower wiring pattern 70 may be formed on the first lower insulating interlayer 50, and may contact the first contact plug 60. In an example embodiment of the present inventive concept, each of a plurality of lower wiring patterns 70 may be electrically connected to at least one of the first, second and the third conductive patterns 104, 130 and 150.

The lower wiring pattern 70 may be covered with a second lower insulating interlayer 80 on the first lower insulating interlayer 50. The second lower insulating interlayer 80 may include an oxide, e.g., silicon oxide.

The first contact plug 60 and the lower wiring pattern 70 may include, e.g., doped polysilicon, a metal, a metal silicide, a metal nitride, etc.

FIGS. 5 to 16 are cross-sectional views illustrating stages of a method of manufacturing the variable resistance memory device shown in FIGS. 4A and 4B in accordance with an example embodiment of the present inventive concept.

Figure 5:
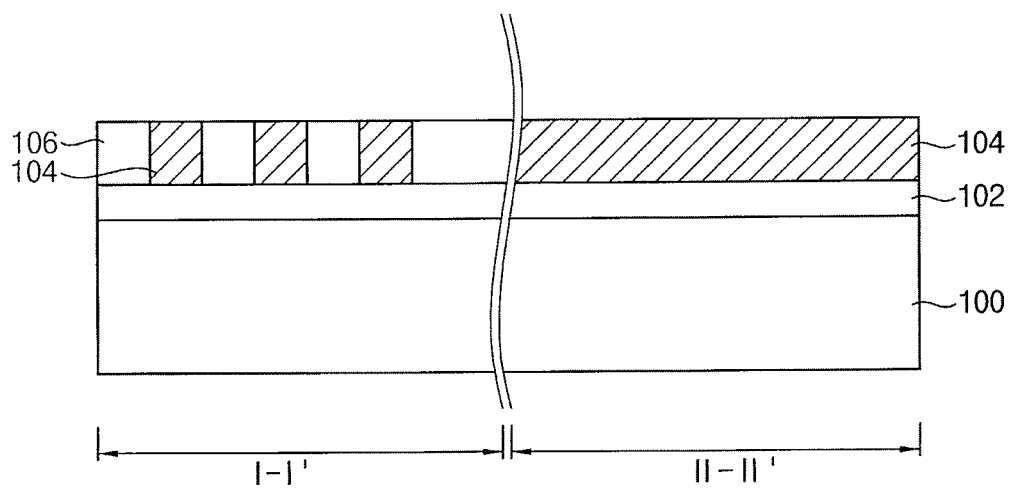
FIGS. 5 to 16 are cross-sectional views illustrating stages of a method of manufacturing the variable resistance memory device shown in FIGS. 4A and 4B in accordance with an example embodiment of the present inventive concept.

Referring to FIG. 5, a conductive pattern 104 extending in the first direction may be formed on a substrate 100. A first insulation pattern 106 may be formed to fill a space between a plurality of first conductive patterns 104 which are spaced apart from each other in the second direction.

In an example embodiment of the present inventive concept, lower elements, e.g., transistors, may be formed on the substrate 100, and an insulation layer 102 may be formed to cover the lower elements. The first conductive pattern 104 may be formed on the insulation layer 102.

In an example embodiment of the present inventive concept, the first conductive pattern 104 may be formed by performing a photolithographic process. For example, a first conductive layer may be formed on the substrate 100. The first conductive layer may include, e.g., a metal or a metal nitride. In an example embodiment of the present inventive concept, the first conductive layer may be formed to include a first barrier layer, a first metal layer and a second barrier layer sequentially stacked. A hard mask may be formed on the first conductive layer, and the first conductive layer may be etched using the hard mask as an etching mask to form the first conductive pattern 104 extending in the first direction. The hard mask may be a photoresist having a pattern for the first conductive pattern 104, and may be formed by a lithographic process. An insulation layer may be formed between a plurality of first conductive patterns 104 which are spaced apart from each other in the second direction. The insulation layer may be planarized to form the first insulation pattern 106. The hard mask may be removed by, for example, ashing, stripping or both.

Alternatively, the first conductive pattern 104 may be formed by a damascene process. For example, a first insulation layer may be formed on the substrate 100. The first insulation layer may be partially etched to form an opening extending in the first direction, and the first insulation layer may be transformed into the first insulation pattern 106. A first conductive layer may be formed to fill the opening. The first conductive layer may be planarized until an upper surface of the first insulation pattern 106 is exposed to form the first conductive pattern 104.

In an example embodiment of the present inventive concept, the first conductive pattern 104 may serve as a first word line.

Figure 6:
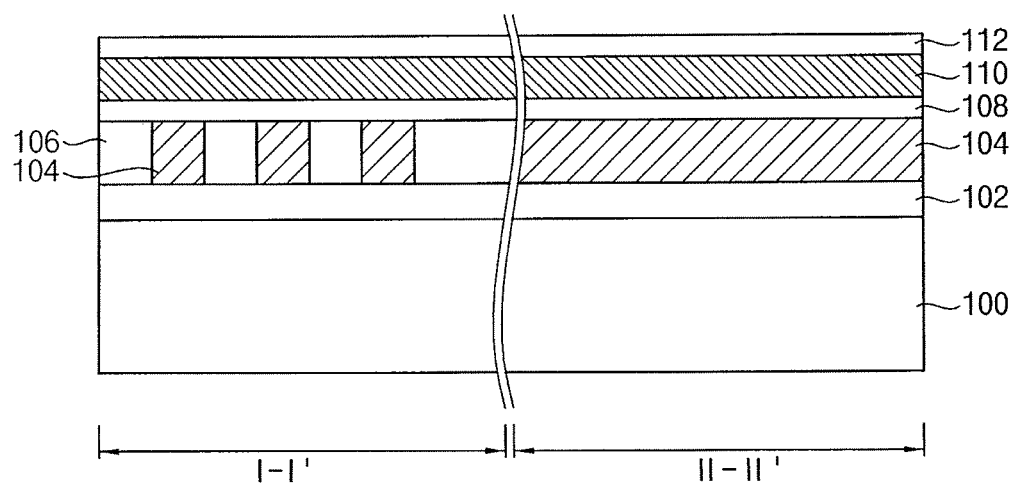

Referring to FIG. 6, a first electrode layer 108, a first selection layer 110, and a second electrode layer 112 may be sequentially formed on the first conductive pattern 104 and the first insulation pattern 106.

The first and second electrode layers 108 and 112 may be formed of, for example, a metal nitride or a metal silicon nitride. In an example embodiment of the present inventive concept, the first and second electrode layers 108 and 112 may not be formed.

In an example embodiment of the present inventive concept, the first selection layer 110 may include an OTS material, which may not undergo a crystallization transformation during switching and may remain amorphous upon removing the applied voltage after switching, and thus the first selection layer 110 may serve as a switching element.

Figure 7:
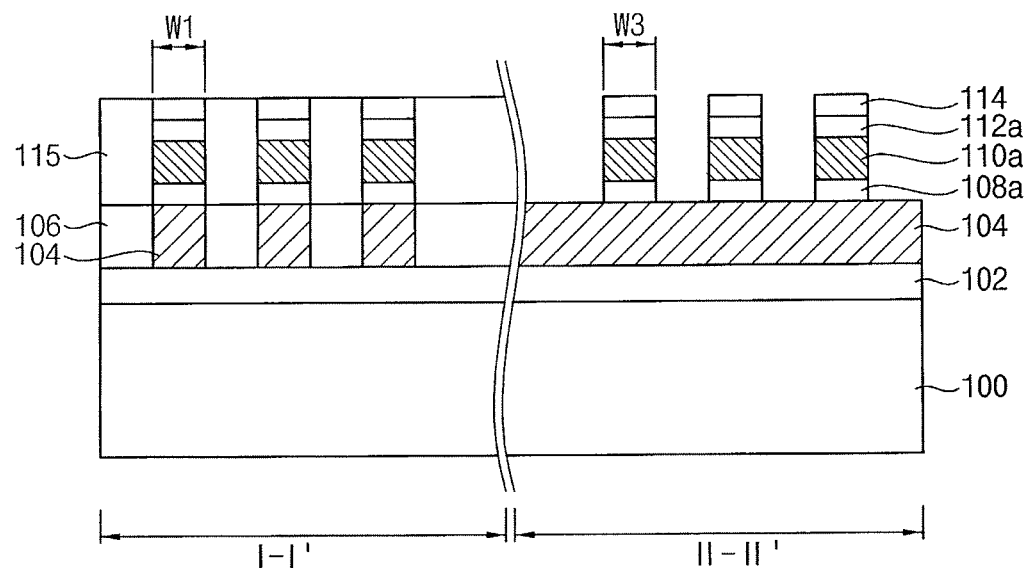

Referring to FIG. 7, the first electrode layer 108, the first selection layer 110 and the second electrode layer 112 may be patterned to form a first electrode 108*a*, a first selection pattern 110*a* and a second electrode 112*a*, respectively, on the first conductive pattern 104. The first electrode 108*a*, the first selection pattern 110*a* and the second electrode 112*a* may be formed by a patterning process including lithographic and etching procedures. A first structure including the first electrode 108*a*, the first selection pattern 110*a* and the second electrode 112*a* sequentially stacked may have a pillar shape. The first structure may have various pillar shapes such as, for example, a tetragonal pillar, a circular pillar, an elliptical pillar, a polygonal pillar, etc.

In an example embodiment of the present inventive concept, the first structure may have a first width W1 in the second direction and a third width W3 in the first direction.

In an example embodiment of the present inventive concept, a preliminary first hard mask having a line shape extending in the first direction may be formed on the second electrode layer 112, and the first electrode layer 108, the first selection layer 110 and the second electrode layer 112 may be etched using the preliminary first hard mask as an etching mask. A preliminary insulation layer 115 may be formed to fill spaces formed by the etching process, and a second hard mask having a line shape extending in the second direction may be formed on the preliminary insulation layer 115 and the second electrode layer 112. The first electrode layer 108, the first selection layer 110, the second electrode layer 112 and the preliminary first hard mask may be etched using the second hard mask as an etching mask. Then, the second hard mask may be removed. Thus, the first electrode layer 108, the first selection layer 110 and the second electrode layer 112 may be etched in each of the first and second directions to form the first electrode 108*a*, the first selection pattern 110*a* and the second electrode 112*a*, respectively. A first hard mask 114 may remain on the second electrode 112*a*.

Alternatively, the first electrode 108*a*, the first selection pattern 110*a* and the second electrode 112*a* may be formed by forming the first hard mask 114 having a pillar shape on the second electrode layer 112, and sequentially etching the second electrode layer 112, the first selection layer 110 and the first electrode layer 108. In this case, the preliminary insulation layer may not be formed. In an example embodiment of the present inventive concept, the first hard mask 114 having the pillar shape may be formed by a double patterning process. For example, each of preliminary hard mask patterns extending in the first direction may be formed by a photolithographic process, and a sacrificial layer may be formed to fill a space between the preliminary hard mask patterns. A photoresist pattern extending in the second direction may be formed on the sacrificial layer and the preliminary hard mask patterns, and the preliminary hard mask patterns may be etched using the photoresist pattern as an etching mask to form the first hard mask 114.

Figure 8:
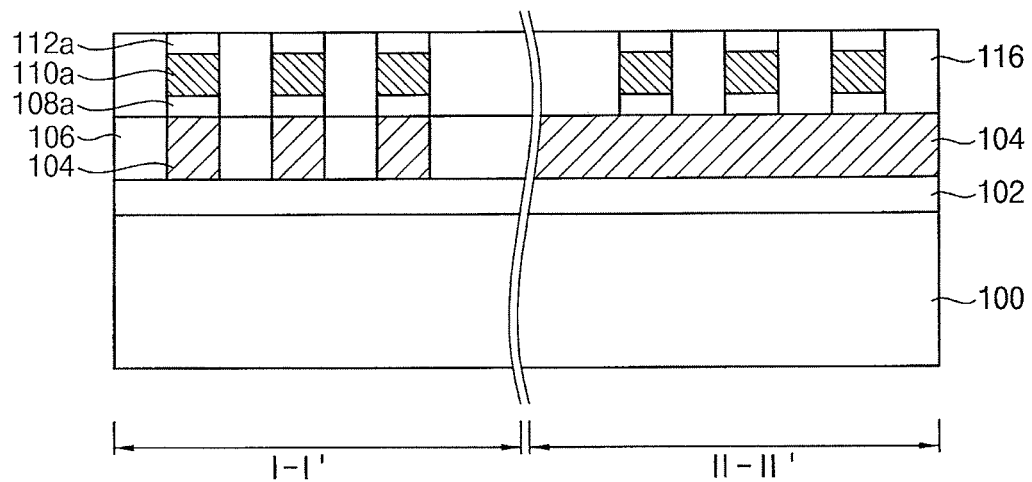

Referring to FIG. 8, a second insulation pattern 116 may be formed to fill a space between the first structures.

In an example embodiment of the present inventive concept, an insulation layer may be formed to sufficiently fill the space between the first structures. In an example embodiment of the present inventive concept, the insulation layer may be formed of, for example, silicon nitride or silicon oxynitride. An upper surface of the insulation layer may be planarized until a top surface of the first hard mask 114 is exposed, and the insulation layer may be partially etched to form the second insulation pattern 116 having a top surface lower than a top surface of the first hard mask 114. The first hard mask 114 may be etched by, e.g., a wet etching process. Thus, an upper surface of the first selection pattern 110*a* may be exposed.

Figure 9:
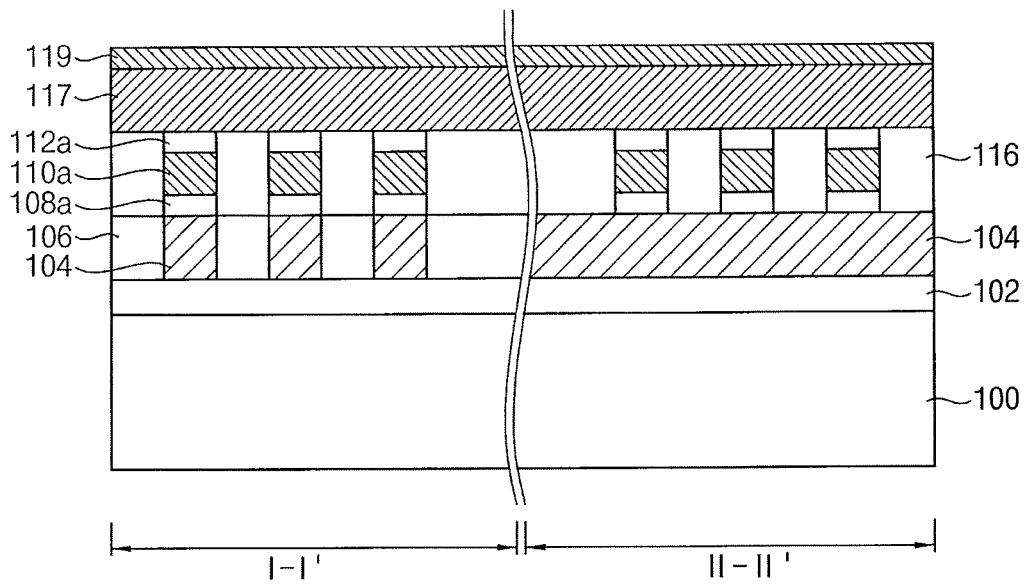

Referring to FIG. 9, a first variable resistance layer 117 and a first heating electrode layer 119 may be sequentially formed on the second electrode 112*a* and the second insulation pattern 116.

In an example embodiment of the present inventive concept, the first variable resistance layer 117 may include a material of which a resistance may be changed by a phase change or a phase transition, for example, a PCM, and may include a chalcogenide-based material in which Ge, Sb and/or Te are combined by a given ratio. In this case, the variable resistance memory device may be a PRAM device.

In an example embodiment of the present inventive concept, the first variable resistance layer 117 may include a material of which a resistance may be changed by a magnetic field or a spin transfer torque (STT). In this case, the variable resistance memory device may be a MRAM device. In an example embodiment of the present inventive concept, the first variable resistance layer 117 may include, e.g., a transition metal oxide or a perovskite-based material. In this case, the variable resistance memory device may be a ReRAM device.

The first heating electrode layer 119 may include a material having a resistance higher than a resistance of each of the first and second electrodes 108*a* and 112*a*. The first heating electrode layer 119 may include a conductive material that generates heat sufficient to phase-change the first variable resistance layer 117 without reacting with the first variable resistance layer 117. In an example embodiment of the present inventive concept, the first heating electrode layer 119 may include, for example, a metal nitride or a metal silicon nitride. The first heating electrode layer 119 may include, e.g., titanium nitride (TiN$_x$), titanium silicon nitride (TiSiN$_x$), tungsten nitride (WN$_x$), tungsten silicon nitride (WSiN$_x$), tantalum nitride (TaN$_x$), tantalum silicon nitride (TaSiN$_x$), zirconium nitride (ZrN$_x$), zirconium silicon nitride (ZrSiN$_x$), titanium aluminum nitride, carbon, etc.

Figure 10:
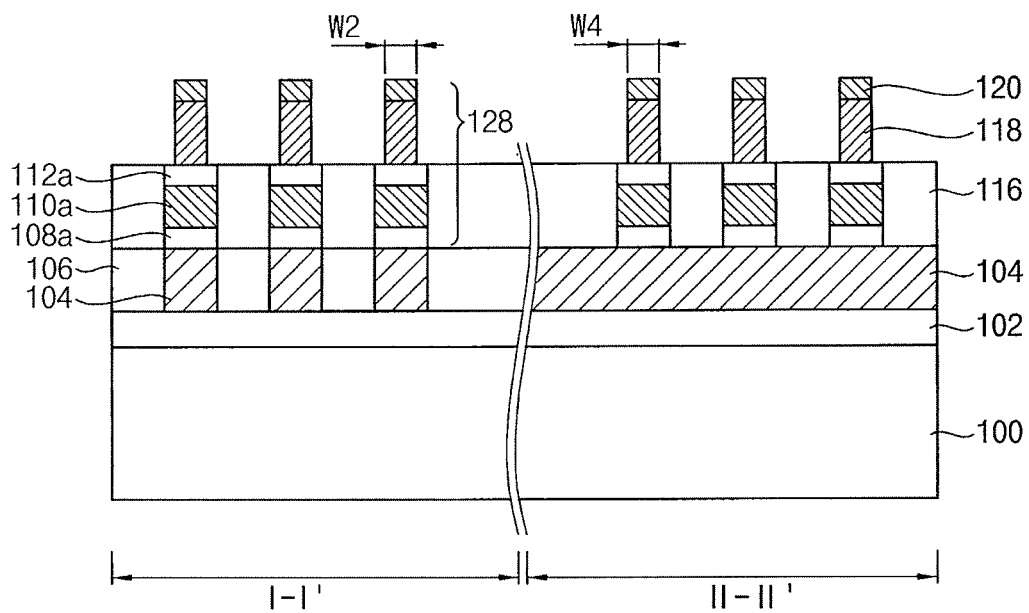

Referring to FIG. 10, the first variable resistance layer 117 and the first heating layer 119 may be patterned to form a first variable resistance pattern 118 and a first heating electrode 120, respectively, on the second electrode 112a.

In an example embodiment of the present inventive concept, each of the first variable resistance pattern 118 and the first heating electrode 120 may have a second width W2 in the second direction smaller than the first width W1, and may have a fourth width W4 in the first direction smaller than the third width W3.

The first variable resistance layer 117 and the first heating layer 119 may be patterned to form a preliminary first variable resistance pattern and a preliminary first heating electrode, respectively, on the second electrode 112a. The preliminary first variable resistance pattern and the preliminary first heating electrode may have widths in the first and second directions substantially the same as widths in the first and second directions of the first structure. Sidewalls of the preliminary first variable resistance pattern and the preliminary first heating electrode may be partially etched to form the first variable resistance pattern 118 and the first heating electrode 120, respectively, having the second width W2 in the second direction and the fourth width W4 in the first direction. The etching process may include, for example, a wet etching process, an isotropic dry etching process, or a cleaning process.

In an example embodiment of the present inventive concept, the first variable resistance pattern 118 and the first heating electrode 120 may be formed by etching the first variable resistance layer 117 and the first heating electrode layer 119 with a line type etching mask extending in the first direction and etching again the first variable resistance layer 117 and the first heating electrode layer 119 with a line type etching mask extending in the second direction.

Alternatively, the first variable resistance pattern 118 and the first heating electrode 120 may be formed by forming a hard mask having a pillar shape, and sequentially etching the first variable resistance layer 117 and the first heating electrode layer 119 using the hard mask as an etching mask. Each of the first variable resistance pattern 118 and the first heating electrode 120 may have a width in each of the first and second directions smaller than a width in each of the first and second directions of the first structure. In an example embodiment of the present inventive concept, the hard mask having the pillar shape may be formed by a double patterning process.

As described above, a first cell structure 128 including the first electrode 108a, the first selection pattern 110a, the second electrode 112a, the first variable resistance pattern 118 and the first heating electrode 120 sequentially stacked, may be formed on the first conductive pattern 104.

Figure 11:
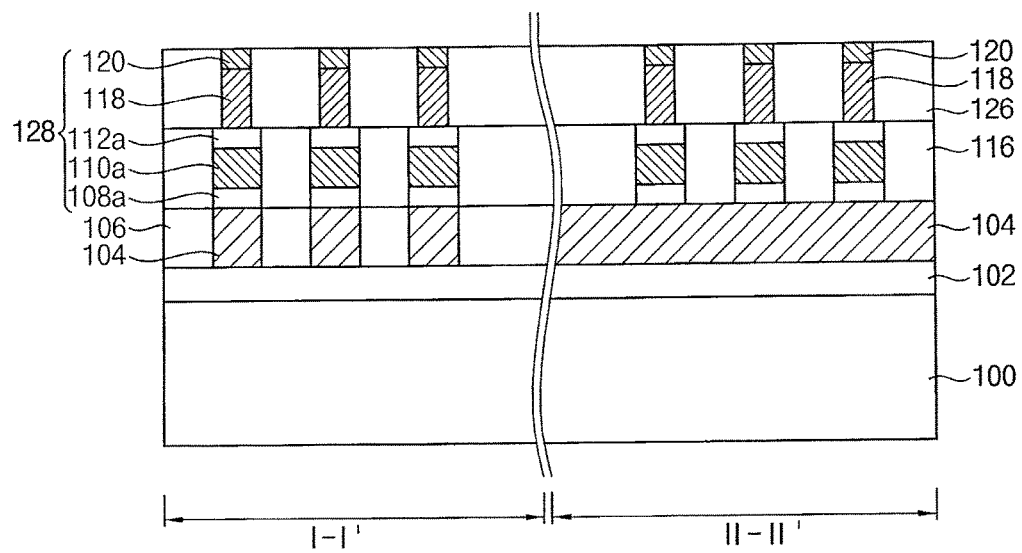

Referring to FIG. 11, an insulation layer may be formed to fill a space between second structures each including the first variable resistance pattern 118 and the first heating electrode 120 sequentially stacked, and an upper surface of the insulation layer may be planarized to form a third insulation pattern 126 between the second structures.

Figure 12:
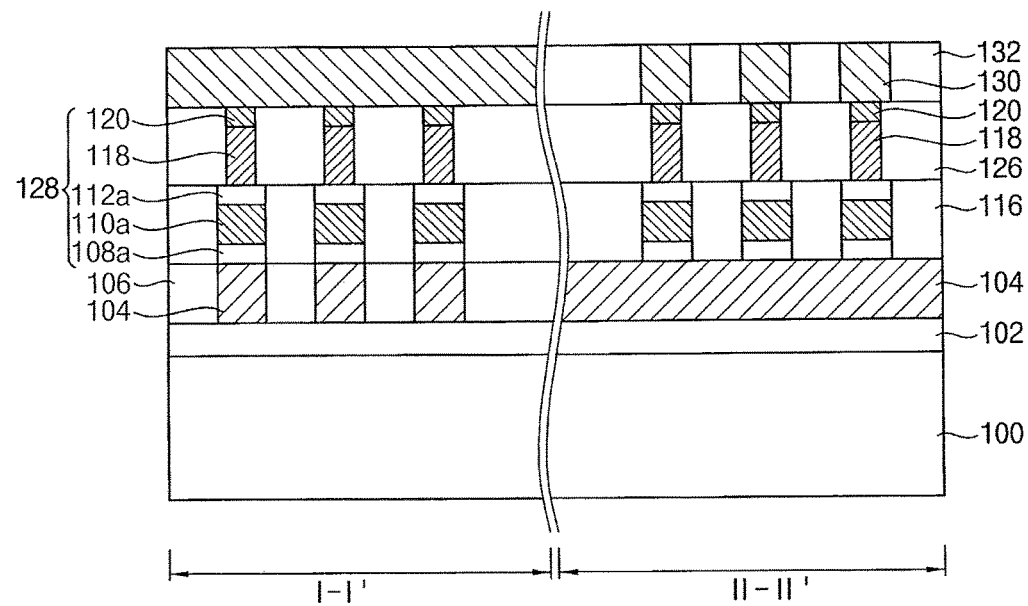

Referring to FIG. 12, a second conductive pattern 130 may be formed on the first heating electrode 120 and the third insulation pattern 126. The second conductive pattern 130 may contact the first heating electrode 120, and may extend in the second direction. A fourth insulation pattern 132 may be formed between a plurality of second conductive patterns 130 which are spaced apart from each other in the first direction.

In an example embodiment of the present inventive concept, a second conductive layer may be formed on the first heating electrode 120 and the third insulation pattern 126, and a hard mask may be formed on the second conductive layer. The second conductive layer may be etched using the hard mask as an etching mask to form a second conductive pattern 130. An insulation layer may be formed to fill a space between a plurality of second conductive patterns 130 which are spaced apart from each other in the first direction. The insulation layer may be planarized until a top surface of the second conductive pattern 130 is exposed to form the fourth insulation pattern 132. Upper surfaces of the fourth insulation pattern 132 and the second conductive pattern 130 may be substantially coplanar with each other.

Alternatively, the second conductive pattern 130 may be formed by a damascene process. For example, an insulation layer may be formed on the first heating electrode 120 and the third insulation pattern 126. The insulation layer may be partially etched to form a trench exposing the first heating electrode and extending in the second direction. A conductive layer may be formed to fill the trench. The conductive layer may be planarized until an upper surface of the insulation layer is exposed to form the second conductive pattern 130. Thus, the fourth insulation pattern 132 may be formed between the second conductive patterns 130. Thus, the first cell structure 128 may be formed at each cross-point of the first and second conductive patterns 104 and 130.

Figure 13:
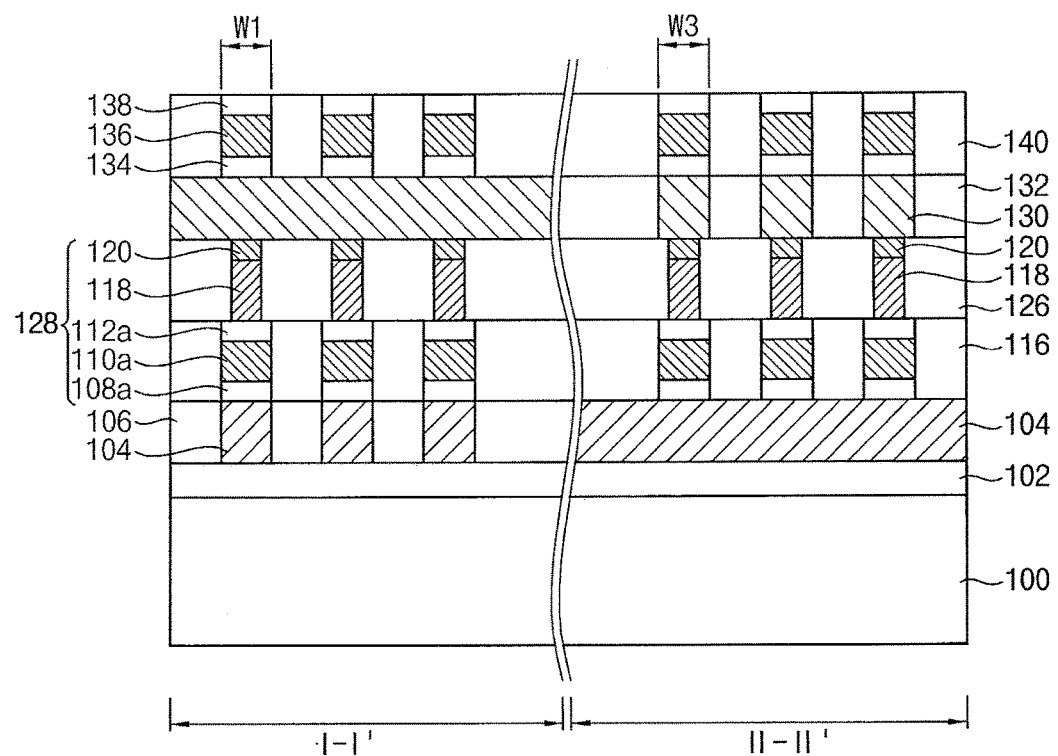

Referring to FIG. 13, a third electrode 134, a second selection pattern 136 and a fourth electrode 138 may be formed on the second conductive pattern 130. A fifth insulation pattern 140 may be formed between a plurality of third structures which are spaced apart from each other in the first and second directions, and each of the plurality third structures may include the third electrode 134, the second selection pattern 136 and the fourth electrode 138 sequentially stacked.

In an example embodiment of the present inventive concept, the third electrode 134, the second selection pattern 136 and a fourth electrode 138 and the fifth insulation pattern 140 may be formed by performing processes substantially the same as or similar to the processes illustrated with reference to FIGS. 6 to 8. Thus, each of the plurality of third structures may have the first width W1 in the second direction and the third width W3 in the first direction.

Figure 14:
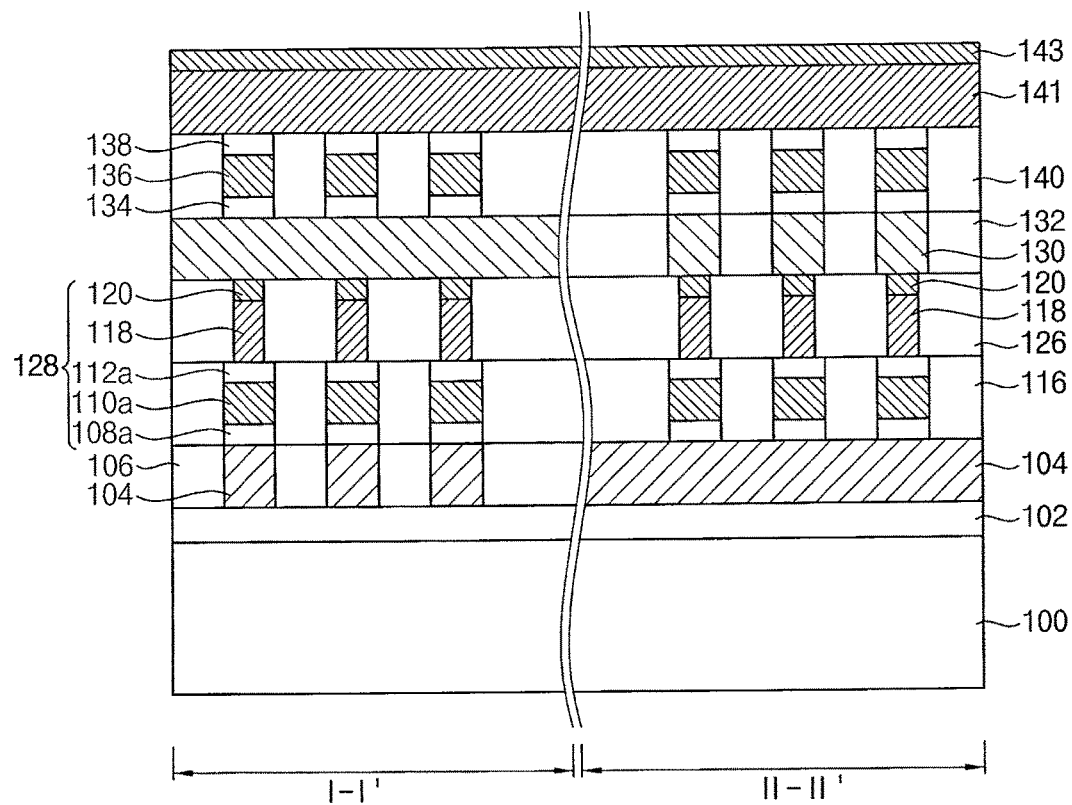

Referring to FIG. 14, a second variable resistance layer 141 and a second heating electrode layer 143 may be formed on the fourth electrode 138 and the fifth insulation pattern 140.

In an example embodiment of the present inventive concept, the second variable resistance layer 141 may include a material substantially the same as a material of the first variable resistance layer 117, and the second heating electrode layer 143 may include a material substantially the same as a material of the first heating electrode layer 119. In an example embodiment of the present inventive concept, the second variable resistance layer 141 and the second heating layer 143 may be formed by performing processes substantially the same as or similar to the processes illustrated with reference to FIG. 9.

Figure 15:
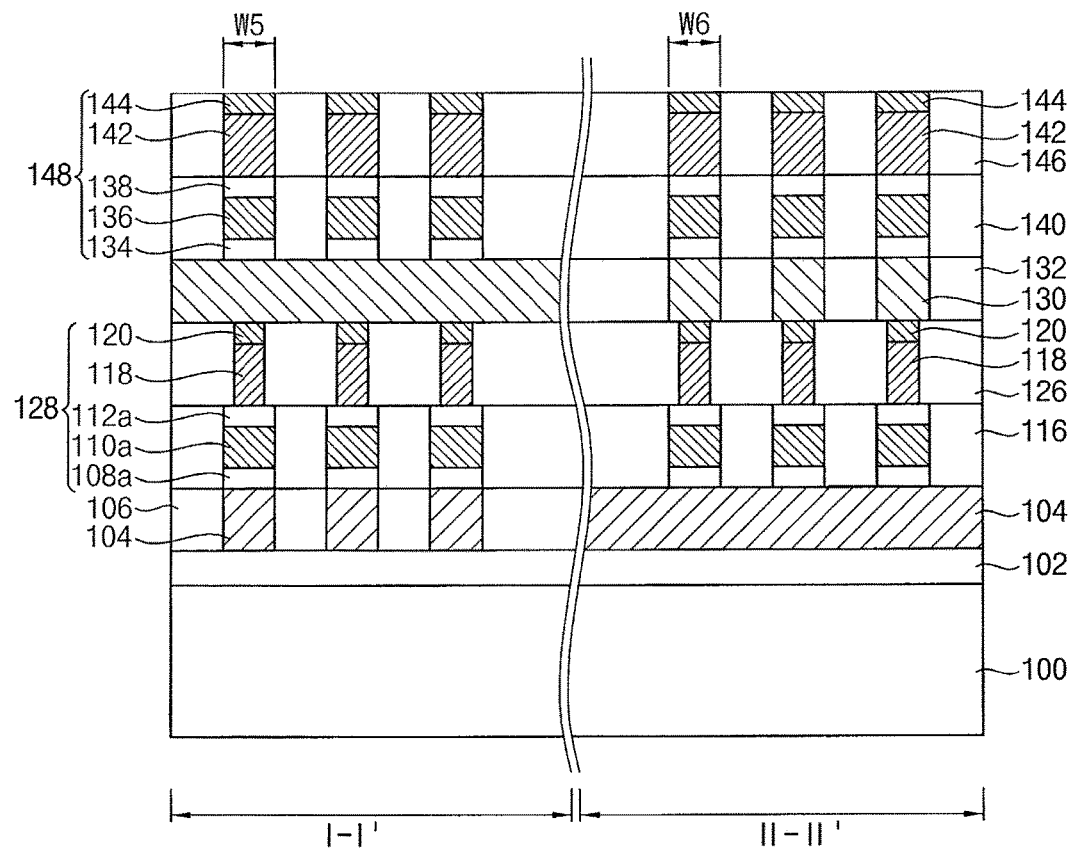

Referring to FIG. 15, the second variable resistance layer 141 and the second heating electrode layer 143 may be patterned to form a second variable resistance pattern 142 and a second heating electrode 144, respectively, on the fourth electrode 138.

In an example embodiment of the present inventive concept, the second variable resistance pattern 142 and the second heating electrode 144 may have a fifth width W5 in the second direction greater than the second width W2, and a sixth width W6 in the first direction greater than the fourth width W4. In an example embodiment of the present inventive concept, the fifth width W5 may be substantially the same as the first width W1, and the sixth width W6 may be substantially the same as the third width W3.

In an example embodiment of the present inventive concept, the second variable resistance pattern 142 and the second heating electrode 144 may be formed by etching the second variable resistance layer 141 and the second heating electrode layer 144 with a line type etching mask extending in the first direction and etching again the second variable resistance layer 141 and the second heating electrode layer 144 with a line type etching mask extending in the second direction.

Alternatively, the second variable resistance pattern 142 and the second heating electrode 144 may be formed by forming a hard mask having a pillar shape, and sequentially etching the second variable resistance layer 141 and the second heating electrode layer 143 using the hard mask. In an example embodiment of the present inventive concept, the hard mask having the pillar shape may be formed by a double patterning process.

As described above, a second cell structure 148 including the third electrode 134, the second selection pattern 136, the fourth electrode 138, the second variable resistance pattern 142 and the second heating electrode 144 stacked, may be formed on the second conductive pattern 130.

A first contact area between the first variable resistance pattern 118 and the first heating electrode 120 in the first cell structure 128 may be smaller than a second contact area between the second variable resistance pattern 142 and the second heating electrode 144 in the second cell structure 148.

Figure 16:
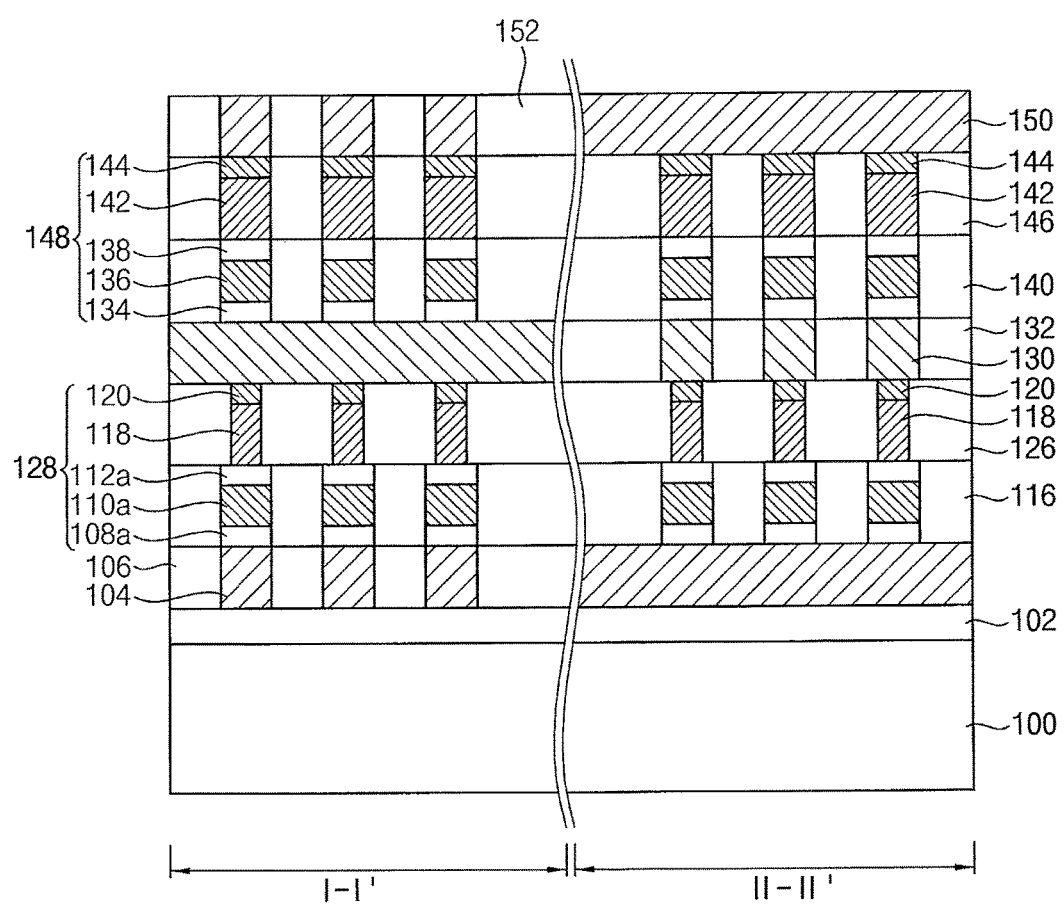

Referring to FIG. 16, an insulation layer may be formed to fill a space between a plurality of fourth structures which are spaced apart from each other in the first and second directions, and an upper surface of the insulation layer may be planarized to form a sixth insulation pattern 146 between the fourth structures. Each of the plurality of fourth structures may include the second variable resistance pattern 142 and the second heating electrode 144 sequentially stacked.

A third conductive pattern 150 may be formed on the second heating electrode 144 and the sixth insulation pattern 146. The third conductive pattern 150 may contact the second heating electrode 144, and may extend in the first direction. A seventh insulation pattern 152 may be formed between a plurality of third conductive patterns 150 which are spaced apart from each other in the second direction.

The processes for forming the sixth insulation pattern 146, the third conductive pattern 150, and the seventh insulation pattern 152, may be substantially the same as or similar to the processes illustrated with reference to FIGS. 11 and 12. Thus, the second cell structure 148 may be formed at a cross-point of the second and third conductive patterns 130 and 150.

In an example embodiment of the present inventive concept, the processes illustrated with reference to FIGS. 5 to 12 may be repeatedly preformed to form the variable resistance memory device including a plurality of cells vertically stacked. That is, a contact area between the variable resistance pattern and the heating electrode in a memory cell at each even level may be different from a contact area between the variable resistance pattern and the heating electrode in the memory cell at each odd level.

Figure 17:
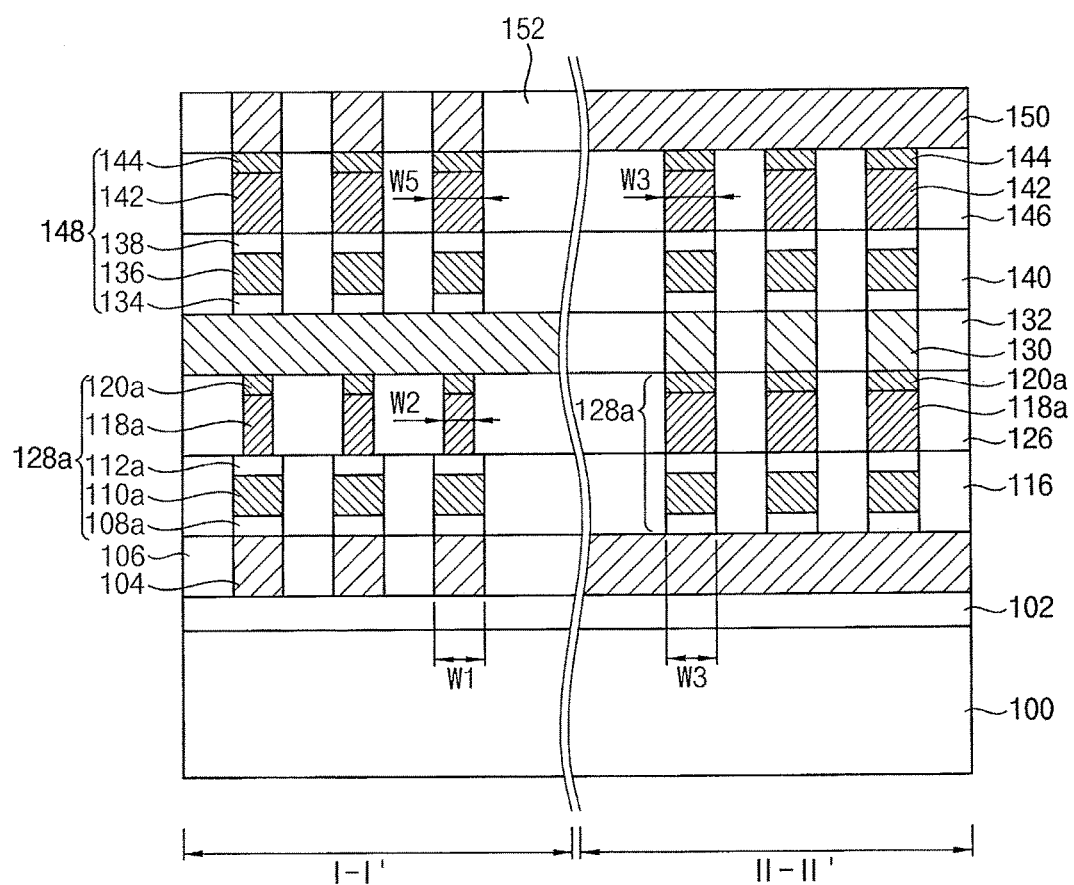
FIG. 17 is a cross-sectional view illustrating a variable resistance memory device in accordance with an example embodiment of the present inventive concept.

FIG. 17 is a cross-sectional view illustrating a variable resistance memory device in accordance with an example embodiment of the present inventive concept.

The variable resistance memory device of FIG. 17 may be substantially the same as or similar to the variable resistance memory device illustrated with reference to FIGS. 4A and 4B, except for the first memory cell structure.

Referring to FIG. 17, a first cell structure 128a may include the first electrode 108a, the first selection pattern 110a, the second electrode 112a, a first variable resistance pattern 118a and a first heating electrode 120a sequentially stacked.

In an example embodiment of the present inventive concept, the first structure including the first electrode 108a, the first selection pattern 110a and the second electrode 112a sequentially stacked may have the first width W1 in the second direction and the third width W3 in the first direction.

In an example embodiment of the present inventive concept, a second structure including the first variable resistance pattern 118a and the first heating electrode 120a sequentially stacked may have the second width W2 in the second direction smaller than the first width W1. The second structure may have the third width W3 in the first direction. That is, the second structure may have a width in the second direction smaller than a width in the second direction of the first structure.

The second cell structure 148 may be substantially the same as the second cell structure illustrated with reference to FIGS. 4A and 4B. That is, the third structure including the third electrode 134, the second selection pattern 136 and the fourth electrode 138 may have the first width W1 in the second direction and the third width W3 in the first direction. The fourth structure including the second variable resistance pattern 142 and the second heating electrode 144 sequentially stacked may have a fifth width W5 greater than the second width W2 in the second direction. In an example embodiment of the present inventive concept, the fifth width W5 may be substantially the same as the first width W1.

The fourth structure may have the third width W3 in the first direction. Thus, widths in the first direction of the first and second cell structures 128a and 148 may be substantially the same as each other.

A width in the second direction of the fourth structure may be greater than a width in the second direction of the second structure. Thus, a second contact area between the second variable resistance pattern 142 and the second heating electrode 144 may be greater than a first contact area between the first variable resistance pattern 118a and the first heating electrode 120a.

Figure 18:
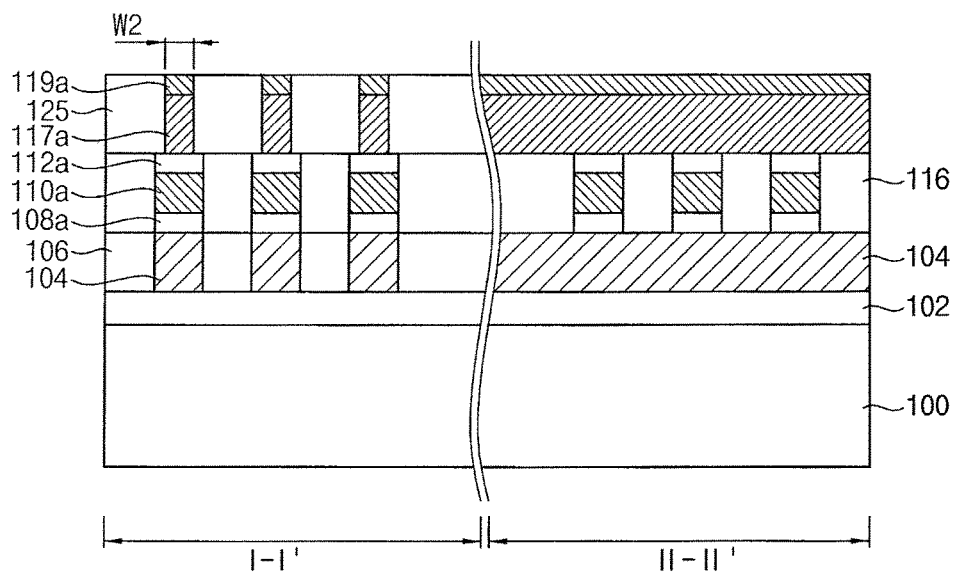
FIGS. 18 and 19 are cross-sectional views illustrating stages of a method of manufacturing the variable resistance memory device shown in FIG. 17 in accordance with an example embodiment of the present inventive concept.
Figure 19:
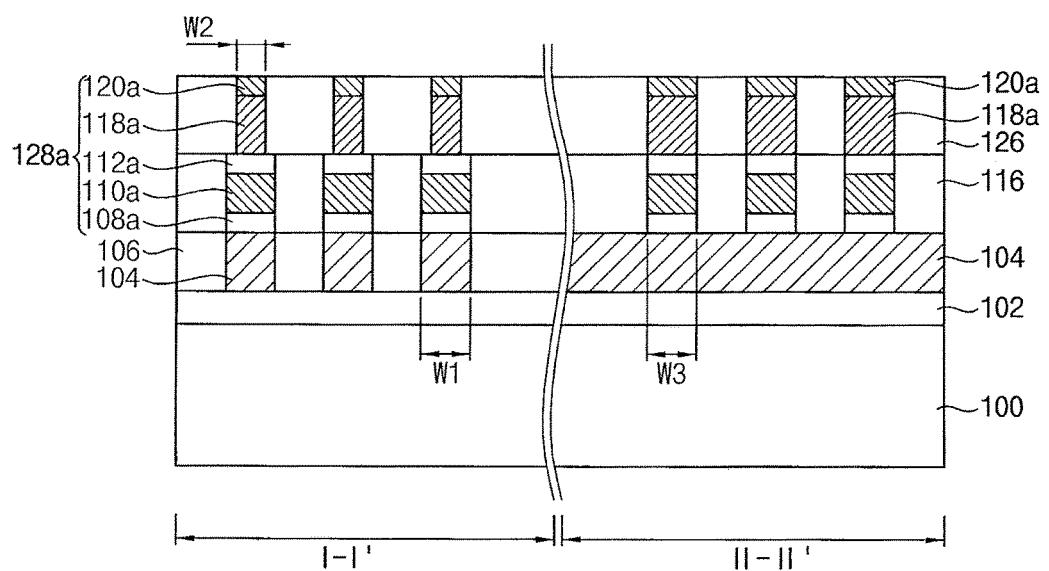

FIGS. 18 and 19 are cross-sectional views illustrating stages of a method of manufacturing the variable resistance memory device shown in FIG. 17 in accordance with an example embodiment of the present inventive concept.

The variable resistance memory device of FIG. 17 may be manufactured by performing processes substantially the same as or similar to the processes illustrated with reference to FIGS. 5 to 16, except for the patterning of the first variable resistance pattern and the first heating electrode.

The first variable resistance layer 117 (refer to FIG. 9) and the first heating electrode layer 119 (refer to FIG. 9) may be formed by substantially the same processes as that illustrated with reference to FIGS. 5 to 9.

Referring to FIG. 18, a hard mask having a line shape extending in the first direction may be formed on the first heating electrode layer 119. The variable resistance layer 117 and the first heating electrode layer 119 may be etched using the hard mask as an etching mask to form a preliminary first variable resistance pattern 117a and a preliminary first heating electrode 119a, respectively, extending in the first direction.

The preliminary first variable resistance pattern 117a and the preliminary first heating electrode 119a may have the second width W2 smaller than the first width W1.

In an example embodiment of the present inventive concept, the variable resistance layer 117 and the first heating electrode layer 119 may be patterned to form a structure having the first width W1, and sidewalls of the structure may be partially etched to form the first variable resistance pattern 118a and the first heating electrode 120a having the second width W2. The etching process may include, for example, a wet etching, an isotropic dry etching process or a cleaning process.

A preliminary third insulation pattern 125 may be formed to fill a space between structures. Each of the structures may include the preliminary first variable resistance pattern 117a and the first preliminary heating electrode 119a sequentially stacked.

Referring to FIG. 19, a hard mask having a line shape extending in the second direction may be formed on the preliminary first heating electrode 119a and the preliminary third insulation pattern 125. The preliminary first variable resistance pattern 117a and the preliminary first heating electrode 119a may be etched using the hard mask as an etching mask to form a first variable resistance pattern 118a and a first heating electrode 120a, respectively, having a pillar shape. The first variable resistance pattern 118a and a first heating electrode 120a may have various pillar shapes such as, for example, a tetragonal pillar, a circular pillar, an elliptical pillar, a polygonal pillar, etc.

The first variable resistance pattern 118a and the first heating electrode 120a may have the third width W3 in the first direction substantially the same as a width in the first direction of the first selection pattern 110a.

Processes the same as or similar to those illustrated with reference to FIGS. 12 to 16 may then be performed to form the variable resistance memory device of FIG. 17.

Figure 20:
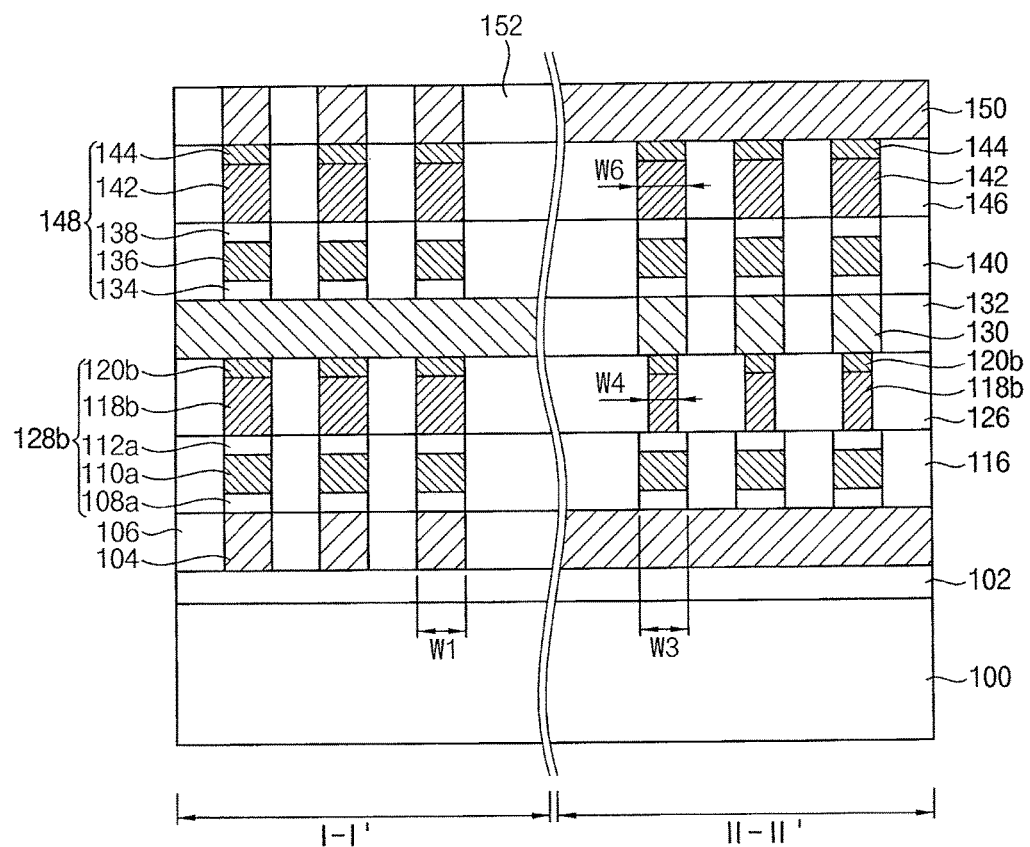
FIG. 20 is a cross-sectional view illustrating a variable resistance memory device in accordance with an example embodiment of the present inventive concept.

FIG. 20 is a cross-sectional view illustrating a variable resistance memory device in accordance with an example embodiment of the present inventive concept.

The variable resistance memory device of FIG. 20 may be substantially the same as or similar to the variable resistance memory device illustrated with reference to FIGS. 4A and 4B, except for the first memory cell structure.

Referring to FIG. 20, a first cell structure 128b may include the first electrode 108a, the first selection pattern 110a, the second electrode 112a, a first variable resistance pattern 118b and a first heating electrode 120b sequentially stacked.

In an example embodiment of the present inventive concept, the first structure including the first electrode 108a, the first selection pattern 110a and the second electrode 112a sequentially stacked may have the first width W1 in the second direction and the third width W3 in the first direction.

In an example embodiment of the present inventive concept, a second structure including the first variable resistance pattern 118b and the first heating electrode 120b sequentially stacked may have the first width W1 in the second direction. The second structure may have a fourth width W4 in the first direction smaller than the third width W3. That is, the first variable resistance pattern 118b and the first heating electrode 120b may have a width in the first direction smaller than a width in the first direction of the first structure.

The second cell structure 148 illustrated in FIG. 20 may be substantially the same as the second cell structure illustrated with reference to FIGS. 4A and 4B. Thus, widths in the second direction of the first and second cell structures 128b and 148 may be substantially the same as each other.

A width in the first direction of the fourth structure may be greater than a width in the first direction of the second structure. Thus, a second contact area between the second variable resistance pattern 142 and the second heating electrode 144 may be greater than a first contact area between the first variable resistance pattern 118b and the first heating electrode 120b.

The variable resistance memory device of FIG. 20 may be manufactured by performing processes substantially the same as or similar to the processes illustrated with reference to FIGS. 5 to 16. However, when the first variable resistance pattern 118b and the first heating electrode 120b are formed, the first variable resistance layer and the first heating electrode layer may be patterned to have the fourth width W4 in the first direction.

Figure 21:
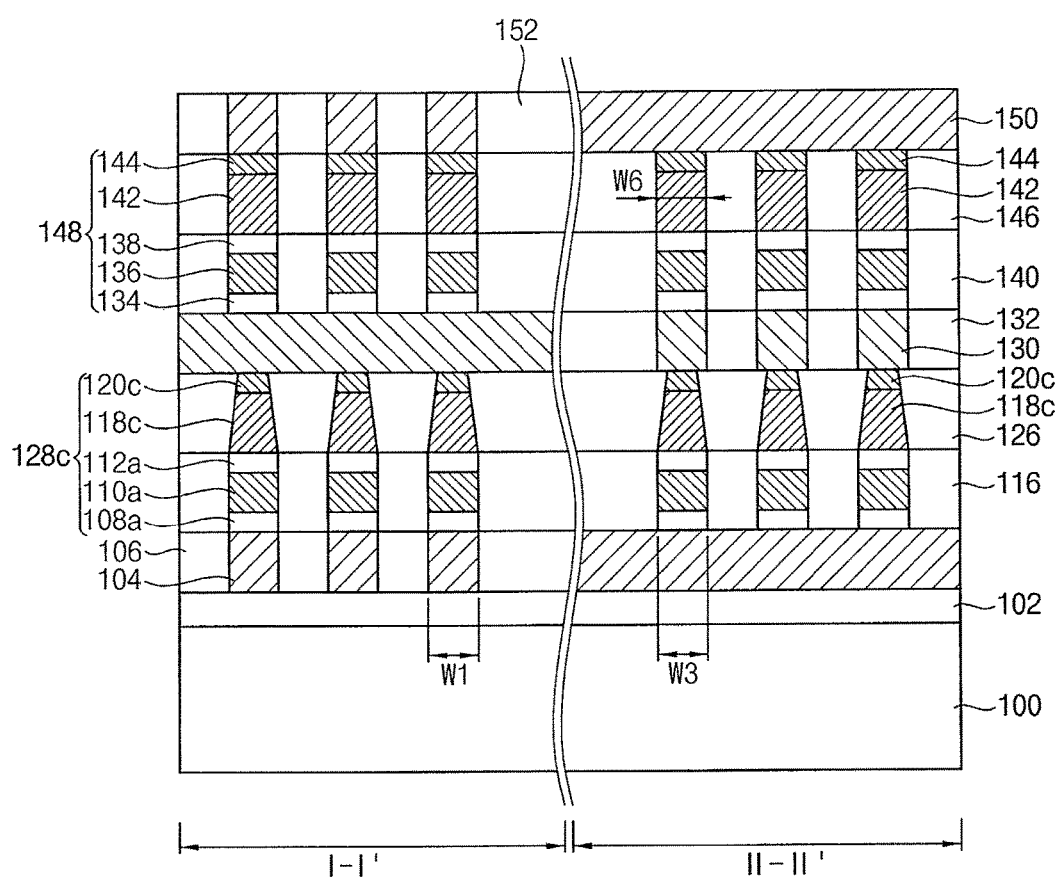
FIG. 21 is a cross-sectional view illustrating a variable resistance memory device in accordance with an example embodiment of the present inventive concept.

FIG. 21 is a cross-sectional view illustrating a variable resistance memory device in accordance with an example embodiment of the present inventive concept.

The variable resistance memory device of FIG. 21 may be substantially the same as or similar to the variable resistance memory device illustrated with reference to FIGS. 4A and 4B, except for the first memory cell structure.

Referring to FIG. 21, a first cell structure 128c may include the first electrode 108a, the first selection pattern 110a, the second electrode 112a, a first variable resistance pattern 118c and a first heating electrode 120c sequentially stacked.

In an example embodiment of the present inventive concept, the first structure including the first electrode 108a, the first selection pattern 110a and the second electrode 112a sequentially stacked may have the first width W1 in the second direction and the third width W3 in the first direction.

A second structure including the first variable resistance pattern 118c and the first heating electrode 120c stacked may have a gradually decreasing width from a bottom toward a top thereof. In an example embodiment of the present inventive concept, a lower portion of the second structure may have the first width W1 in the second direction and the third width W3 in the first direction.

In an example embodiment of the present inventive concept, the second structure may have gradually decreasing widths in the first and second directions, respectively, from a bottom toward a top thereof.

In an example embodiment of the present inventive concept, the second structure may have a gradually decreasing width in the second direction from a bottom toward a top thereof, and may have a uniform width in the first direction.

In an example embodiment of the present inventive concept, the second structure may have a gradually decreasing width in the first directions from a bottom toward a top thereof, and may have a uniform width in the second direction.

The second cell structure of FIG. 21 may be substantially the same as the second cell structure illustrated with reference to FIGS. 4A and 4B.

A width of the first structure may be greater than a width of the second structure. Thus, a second contact area between the second variable resistance pattern 142 and the second heating electrode 144 may be greater than a first contact area between the first variable resistance pattern 118c and the first heating electrode 120c.

The variable resistance memory device of FIG. 21 may be manufactured by performing processes substantially the same as or similar to the processes illustrated with reference to FIGS. 5 to 16. However, when the first variable resistance pattern 118c and the first heating electrode 120c are formed, the first variable resistance layer and the first heating electrode layer may be patterned such that sidewalls of the first variable resistance pattern 118c and the first heating electrode 120c may have a slope.

Figure 22:
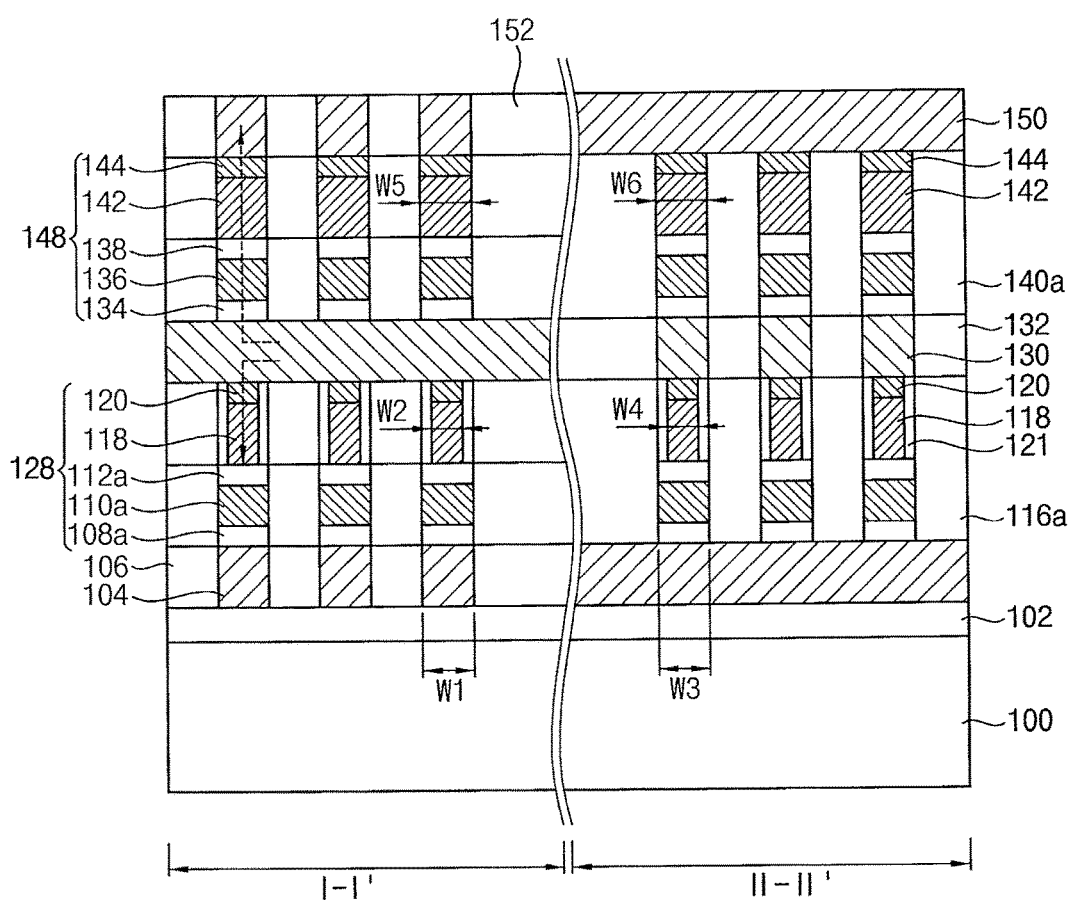
FIG. 22 is a cross-sectional view illustrating a variable resistance memory device in accordance with an example embodiment of the present inventive concept.

FIG. 22 is a cross-sectional view illustrating a variable resistance memory device in accordance with an example embodiment of the present inventive concept.

The variable resistance memory device of FIG. 22 may be substantially the same as or similar to the variable resistance memory device illustrated with reference to FIGS. 4A and 4B, except for a first spacer on a sidewall of the first memory cell structure.

Referring to FIG. 22, the first cell structure 128 may include the first electrode 108a, the first selection pattern 110a, the second electrode 112a, the first variable resistance pattern 118 and the first heating electrode 120 sequentially stacked.

The first structure including the first electrode 108a, the first selection pattern 110a and the second electrode 112a sequentially stacked may be substantially the same as or similar to that illustrated with reference to FIGS. 4A and 4B.

A first spacer 121 may surround sidewalls of the second structure including the first variable resistance pattern 118 and the first heating electrode 120 sequentially stacked. The first spacer 121 may include, e.g., silicon oxide, silicon nitride, etc. Also, the first spacer 121 may be formed by methods in conformal deposition technology such as atomic layer deposition (ALD) and chemical vapor deposition (CVD) including thermal and plasma deposition technology.

In an example embodiment of the present inventive concept, according to a shape of the first spacer 121, an upper width of the first heating electrode 120 may be greater than a lower width of the first heating electrode 120.

In an example embodiment of the present inventive concept, the second structure may have a width smaller than a width of the first structure. A width including the width of the second structure and a thickness (including two layers, one on each sidewall) of the first spacer 121 may be substantially the same as the width of the first structure.

In an example embodiment of the present inventive concept, a spacer may not be formed on sidewalls of the fourth structure including the second variable resistance pattern 142 and the second heating electrode 144 sequentially stacked. In this case, the width including the width of the second structure and the thickness (including two layers, one on each sidewall) of the first spacer 121 may be substantially the same as a width of the fourth structure. In an example embodiment of the present inventive concept, a second spacer may be formed on sidewalls of the fourth structure, and the second spacer may have a thickness smaller than the thickness of the first spacer 121. In this case, the width including the width of the second structure and the thickness (including two layers, one on each sidewall) of the first spacer 121 may be substantially the same as a width including the width of the fourth structure and the thickness (including two layers, one on each sidewall) of the second spacer.

In an example embodiment of the present inventive concept, a width of the fourth structure may be greater than a width of the second structure. Thus, a second contact area between the second variable resistance pattern 142 and the second heating electrode 144 may be greater than a first contact area between the first variable resistance pattern 118 and the first heating electrode 120.

FIGS. 23 to 28 are cross-sectional views illustrating stages of a method of manufacturing the variable resistance memory device shown in FIG. 22 in accordance with an example embodiment of the present inventive concept.

The processes illustrated with reference to FIGS. 5 to 7 may be performed first before performing the processes illustrated in FIGS. 23 to 28.

Figure 23:
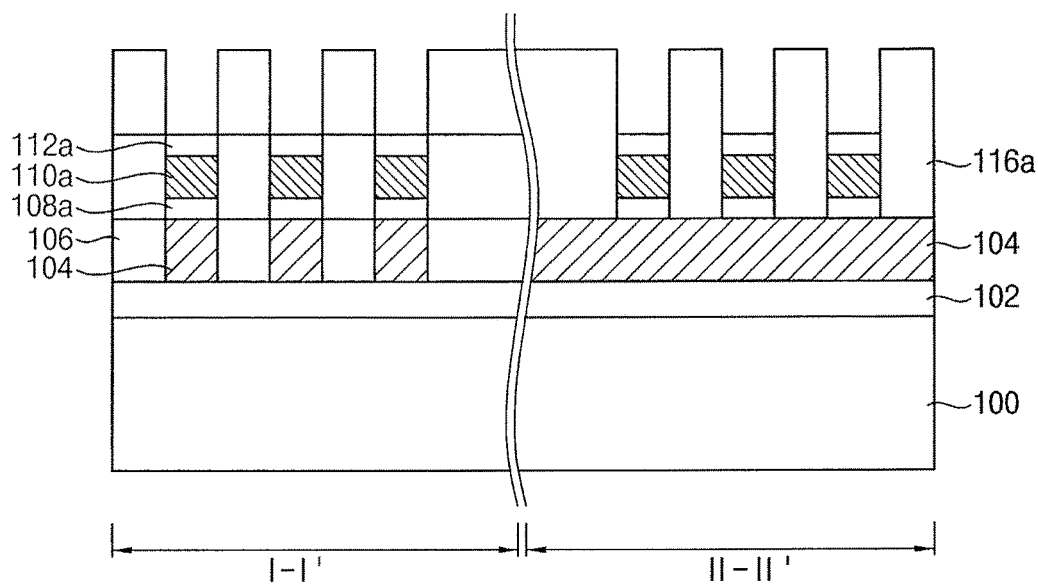
FIGS. 23 to 28 are cross-sectional views illustrating stages of a method of manufacturing the variable resistance memory device shown in FIG. 22 in accordance with an example embodiment of the present inventive concept.

Referring to FIG. 23, an insulation layer may be formed to fill a space between the first structures of which each includes the first electrode 108a, the first selection pattern 110a and the second electrode 112a sequentially stacked. The insulation layer may be partially etched to form a second insulation pattern 116a including an opening, which may expose an upper surface of the second electrode 112a.

In an example embodiment of the present inventive concept, the first hard mask 114 (refer to FIG. 7) may remain on the second electrode 112a. The first hard mask 114 may be formed to have a thickness substantially the same as or greater than a thickness of the second structure including the first variable resistance pattern and the first heating electrode sequentially stacked. An insulation layer may be formed to cover the first hard mask 114, and an upper surface of the insulation layer may be planarized until an upper surface of the first hard mask 114 is exposed. The first hard mask may be removed, so that the second insulation pattern 116a having the opening exposing the upper surface of the second electrode 112a may be formed.

Figure 24:
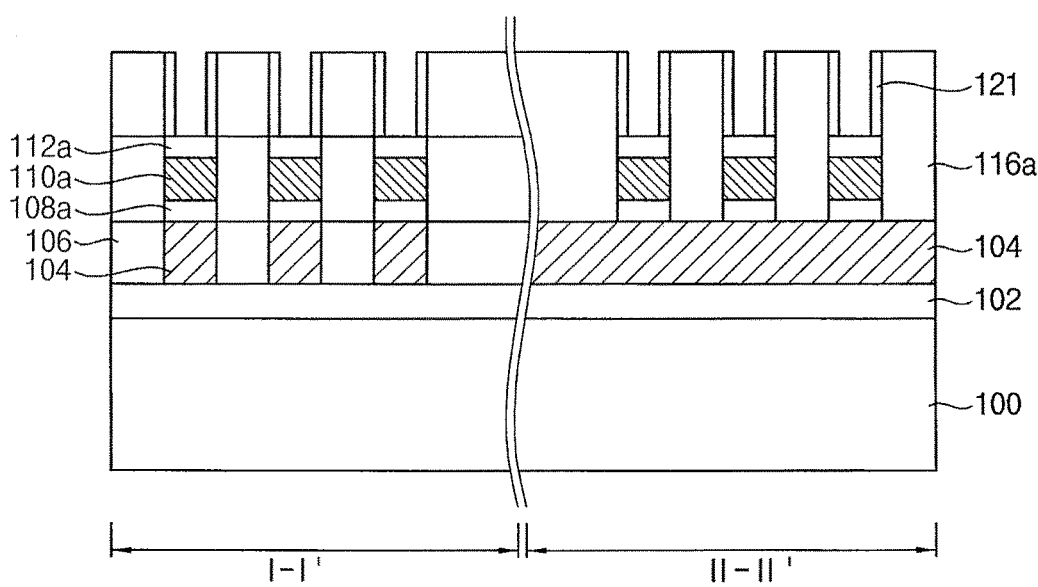
Figure 25:
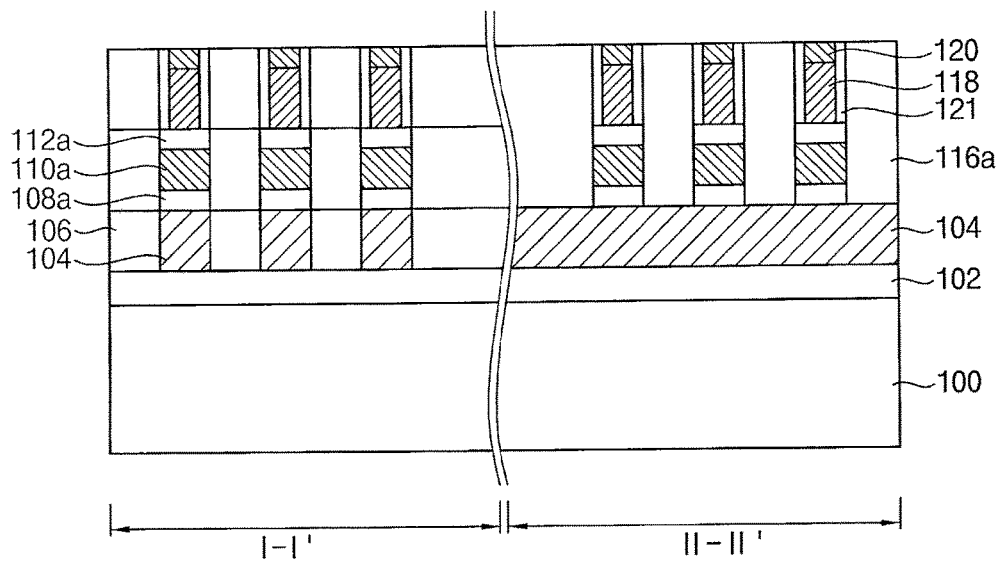

Referring to FIGS. 24 and 25, a first spacer 121 may be formed on sidewalls of the opening. The first variable resistance pattern 118 and the first heating electrode 120 may be formed to fill a remaining portion of the opening.

In an example embodiment of the present inventive concept, a spacer layer may be formed on the second electrode 112a, the second insulation pattern 116a and the sidewalls of the opening. The spacer layer may be formed by methods in conformal deposition technology, for example, ALD, CVD, etc. The spacer layer may be anisotropically etched to form the first spacer 121 on the sidewalls of the opening.

A variable resistance layer may be formed on the second electrode 112a, the first spacer 121 and the second insulation pattern 116a to fill the opening, and the variable resistance layer may be planarized until an upper surface of the second insulation pattern 116a may be exposed. Then, an upper portion of the variable resistance layer may be removed by an etch back process to form the first variable resistance pattern 118, which may partially fill the opening. The planarization process may include e.g., a chemical mechanical polishing (CMP) process.

A first heating electrode layer may be formed on the first variable resistance pattern 118, the first spacer 121 and the second insulation pattern 116a to fill the opening, and the first heating electrode layer may be planarized until the upper surface of the second insulation pattern 116a is exposed to form the first heating electrode 120 filling a remaining portion of the opening. That is, the second structure may be formed by a damascene process.

As the first spacer 121 is formed, a width of the second structure may be smaller than a width of the first structure. However, combining the width of the second structure with the thickness of the spacer on both sidewalls will have a width substantially the same as the width of the first structure.

Figure 26:
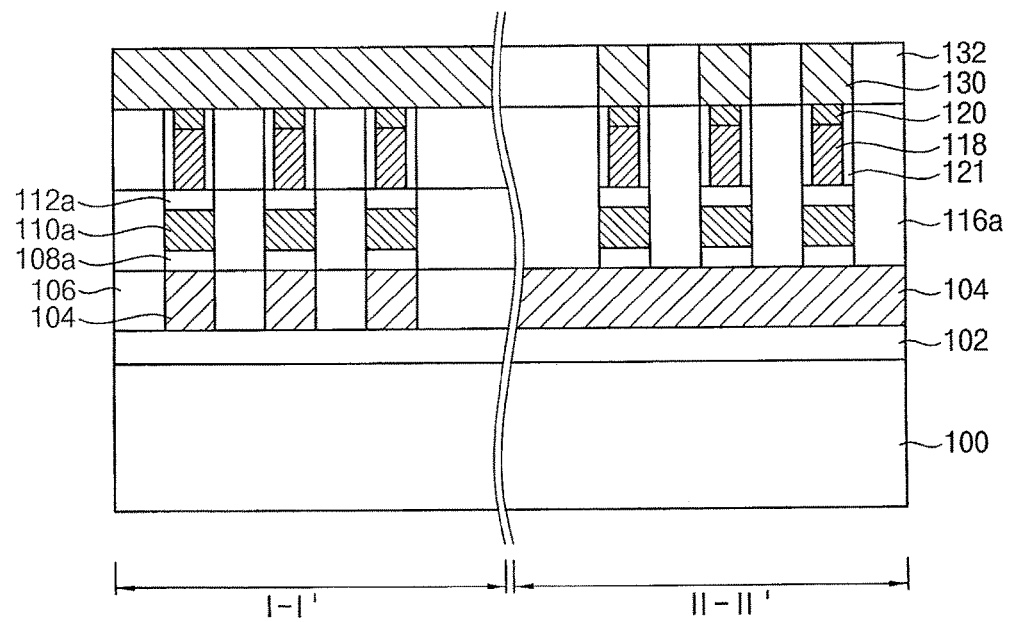

Referring to FIG. 26, the second conductive pattern 130 may be formed on the first heating electrode 120, the first spacer 121 and the second insulation pattern 116a. The second conductive pattern 130 may contact the first heating electrode 120, and may extend in the second direction. A fourth insulation pattern 132 may be formed between a plurality of second conductive patterns 130 which are spaced apart from each other in the first direction.

In an example embodiment of the present inventive concept, the second conductive pattern 130 illustrated in FIG. 26 may be formed by processes substantially the same as or similar to the processes illustrated with reference to FIG. 12. Thus, the first cell structure 128 may be formed at a cross-point of the first and the second conductive patterns 104 and 130.

Figure 27:
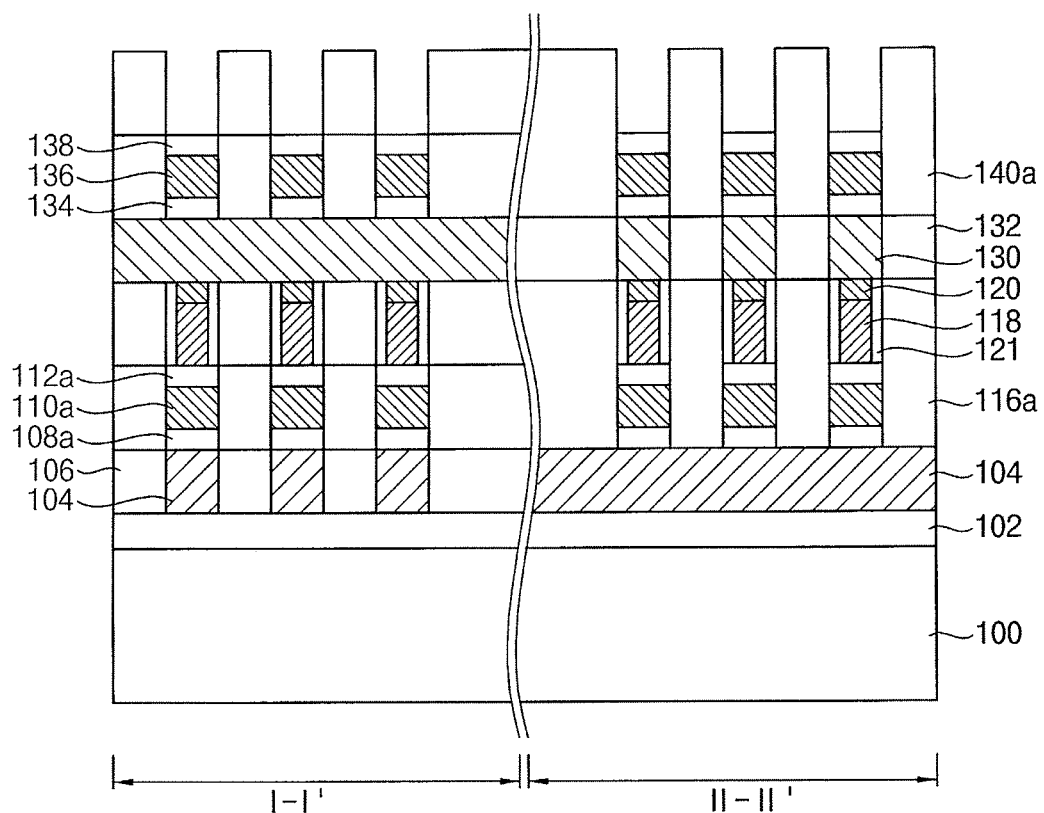

Referring to FIG. 27, the third electrode 134, the second selection pattern 136 and the fourth electrode 138 may be sequentially formed on the second conductive pattern 130 by performing the processes substantially the same as or similar to the processes illustrated with reference to FIG. 13.

An insulation layer may be formed to cover the third structure including the third electrode 134, the second selection pattern 136 and the fourth electrode 138 sequentially stacked. The insulation layer may be partially etched to form the fifth insulation pattern 140a including the opening exposing an upper surface of the fourth electrode 138. The processes for forming the fifth insulation pattern 140a in FIG. 27 may be substantially the same as or similar to the processes illustrated with reference to FIG. 23.

Figure 28:
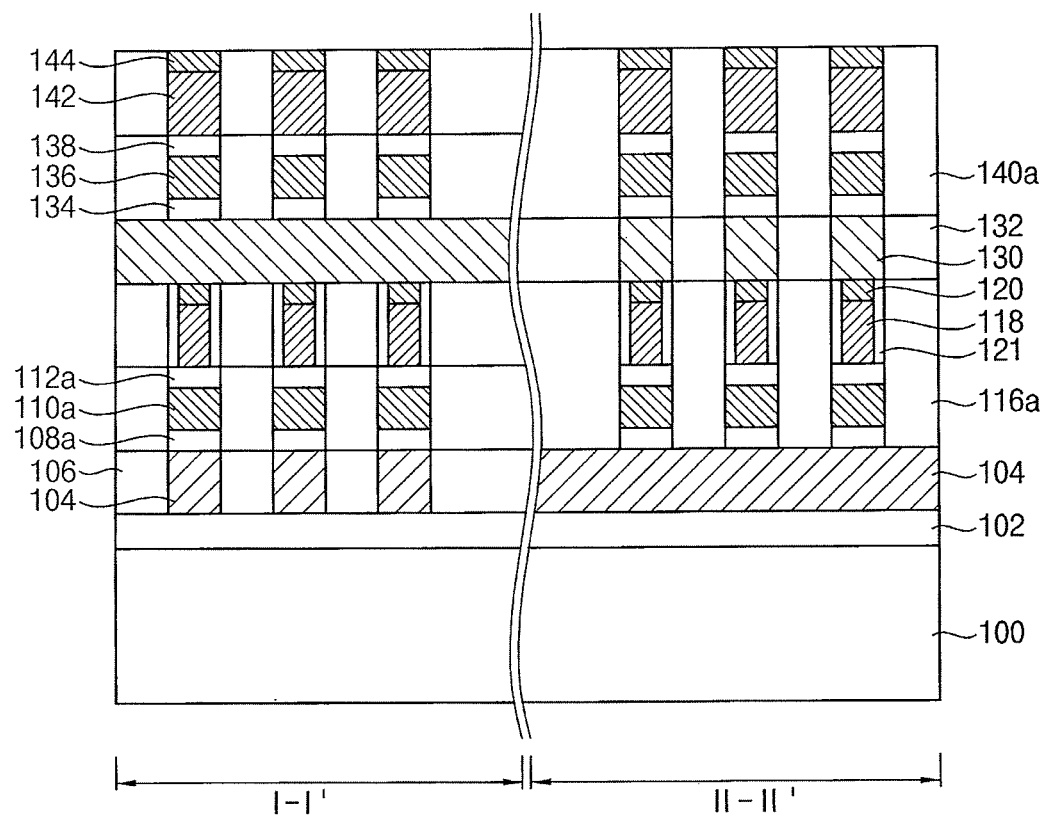

Referring to FIG. 28, the second variable resistance pattern 142 and the second heating electrode 144 may be formed in the opening.

In an example embodiment of the present inventive concept, the variable resistance layer may be formed on the fourth electrode 138 and the fifth insulation pattern 140a to fill the opening. The variable resistance layer may be planarized until an upper surface of the fifth insulation pattern 140a may be exposed. Then, an upper portion of the variable resistance layer may be removed by an etch back process to form the second variable resistance pattern 142, which may partially fill the opening.

In an example embodiment of the present inventive concept, a second spacer may be further formed on the sidewalls of the opening. In this case, the second spacer may have a thickness smaller than a thickness of the first spacer 121.

As described above, a fourth structure including the second variable resistance pattern 142 and the second heating electrode 144 may be formed by a damascene process.

A width of the fourth structure may be greater than a width of the second structure. However, combining the width of the second structure with the thickness of the spacer on both sidewalls will have a width substantially the same as the width of the fourth structure. Thus, a second contact area between the second variable resistance pattern 142 and the second heating electrode 144 may be greater than a first contact area between the first variable resistance pattern 118 and the first heating electrode 120.

The third conductive pattern 150 may be formed on the second heating electrode 144 and the fifth insulation pattern 140a.

Figure 29:
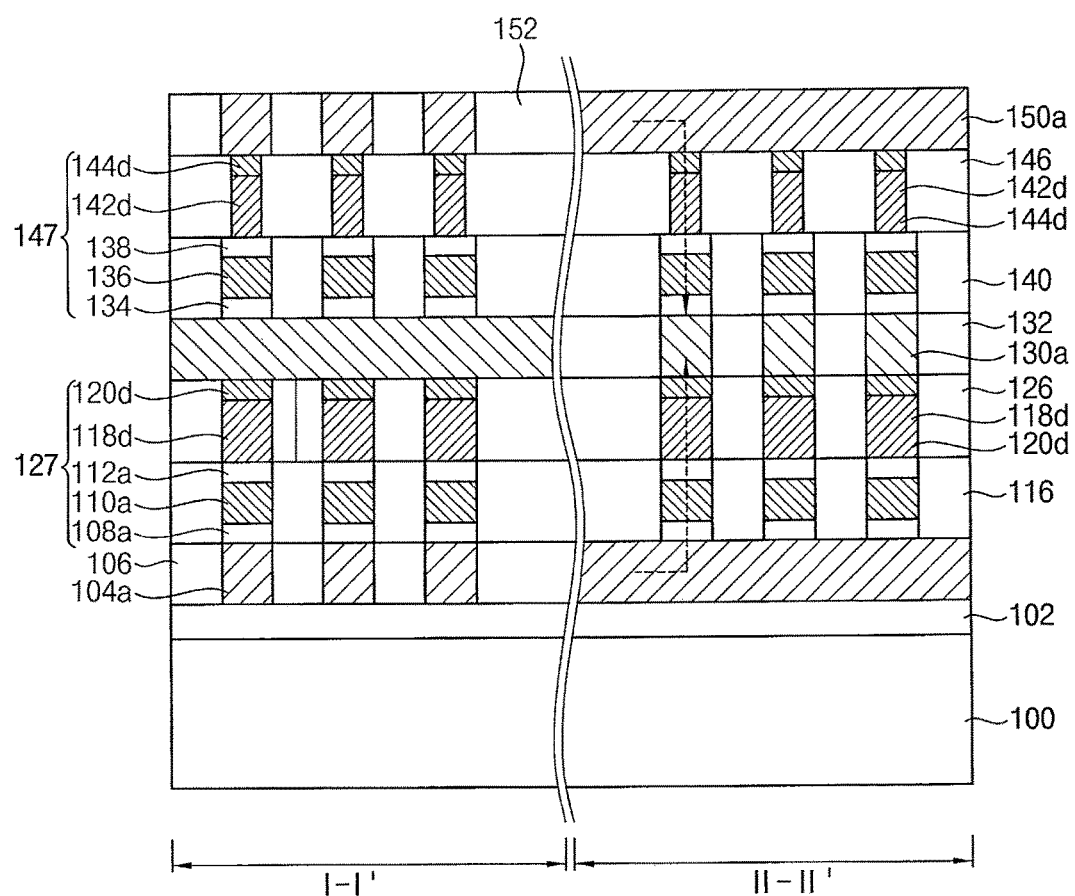
FIG. 29 is a cross-sectional view illustrating a variable resistance memory device in accordance with an example embodiment of the present inventive concept.

FIG. 29 is a cross-sectional view illustrating a variable resistance memory device in accordance with an example embodiment of the present inventive concept.

Referring to FIG. 29, the variable resistance memory device may include the first conductive pattern 104a, a first cell structure 127, the second conductive pattern 130a, a second cell structure 147 and the third conductive pattern 150a.

The first cell structure 127 may include the first selection pattern 110a, a first variable resistance pattern 118d and a first heating electrode 120d sequentially stacked. That is, the first heating electrode 120d may be formed on and contacted with the first variable resistance pattern 118d.

In an example embodiment of the present inventive concept, the first electrode 108a may be further formed beneath a lower surface of the first selection pattern 110a, and the second electrode 112a may be further formed on an upper surface of the first selection pattern 110a. In an example embodiment of the present inventive concept, the first and second electrodes 108a and 112a may include a metal or a metal nitride having a resistance lower than a resistance of the first heating electrode 120d.

The second cell structure 147 may include the second selection pattern 136, a second variable resistance pattern 142d and a second heating electrode 144d sequentially stacked. That is, the second heating electrode 144d may be formed on and contacted with the second variable resistance pattern 142d.

In an example embodiment of the present inventive concept, the third electrode 134 may be further formed beneath a lower surface of the second selection pattern 136 and the fourth electrode 138 may be further formed on an upper surface of the second selection pattern 136. In an example embodiment of the present inventive concept, the third and fourth electrodes 134 and 138 may include a metal or a metal nitride having a resistance lower than a resistance of the second heating electrode 144d.

A first contact area between the first variable resistance pattern 118d and the first heating electrode 120d may be different from a second contact area between the second variable resistance pattern 142d and the second heating electrode 144d. In an example embodiment of the present inventive concept, the second contact area may be smaller than the first contact area.

In an example embodiment of the present inventive concept, the first and third conductive patterns 104a and 150a may serve as a first bit line and a second bit line, respectively. The second conductive pattern 130a may serve as a common word line.

A voltage may be applied to the first conductive pattern 104a serving as the first bit line, and a first current may flow into the second conductive pattern 130a through the first selection pattern 110a, the first variable resistance pattern 118d and the first heating electrode 120d, so that data may be written in each of the first cell structures 127. That is, the first current may flow in the fourth direction, i.e., a direction from a variable resistance pattern toward a heating electrode, during an operation of the first cell structure 127.

A voltage may be applied to the third conductive pattern 150a serving as the second bit line, and a second current may flow into the second conductive pattern 130a through the second heating electrode 144d, the second variable resistance pattern 142d and the second selection pattern 136, so that data may be written in each of the second cell structures 147. That is, the second current may flow in the third direction, i.e., a direction from a heating electrode toward a variable resistance pattern, during an operation of the second cell structure 147.

Even if the first and second cell structures 127 and 147 have substantially the same structure, reset currents of the first and second cell structures 127 and 147 may be different from each other. For example, the reset current of the second cell structure 147 may be higher than the reset current of the first cell structure 127. However, in an example embodiment of the present inventive concept, the second contact area of the second cell structure 147 may be smaller than the first contact area of the first cell structure 127, so that a difference between reset currents of the first and second cell structures 127 and 147 may be reduced.

As the first and second contact areas may be different from each other, a difference between reset currents of the first and second cell structures 127 and 147 may be eliminated or minimized by adjusting the difference between the first and second contact areas. In an example embodiment of the present inventive concept, reset currents of the first and second cell structures 127 and 147 may be substantially the same as each other.

A current direction in a first case of the second conductive pattern 130a serving as the common word line and a current direction in a second case of the second conductive pattern 130a serving as the common bit line may be different from each other. Thus, according to the current directions, the first and second contact areas may be controlled, respectively.

Each of example embodiments of FIGS. 17, 20 and 22 may be modified to have the second conductive pattern serving as the common word line and the first and third conductive patterns serving as the first and second bit lines, respectively. In this case, in each of example embodiments of FIGS. 17, 20 and 22, the first contact area may be greater than the second contact area. That is, a width of the fourth structure may be smaller than a width of the second structure.

Figure 30:
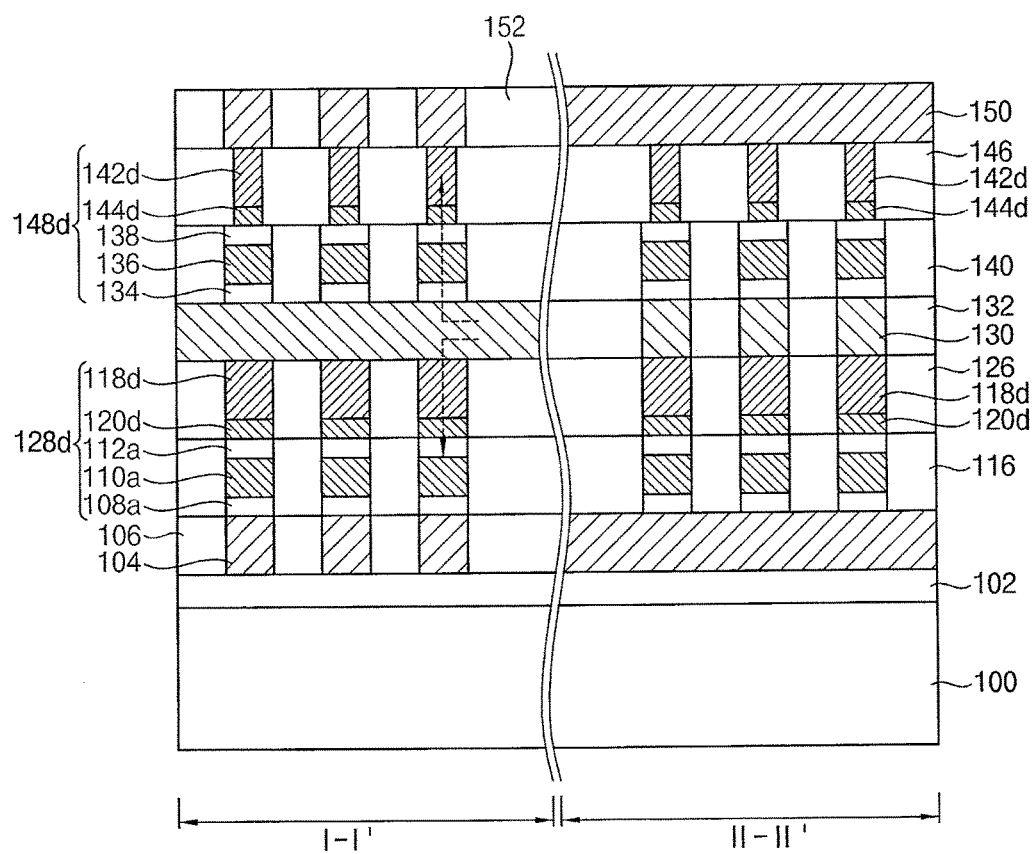
FIG. 30 is a cross-sectional view illustrating a variable resistance memory device in accordance with an example embodiment of the present inventive concept.

FIG. 30 is a cross-sectional view illustrating a variable resistance memory device in accordance with an example embodiment of the present inventive concept.

The variable resistance memory device of FIG. 30 may be substantially the same as or similar to the variable resistance memory device illustrated with reference to FIGS. 4A and 4B, except for first and second cell structures.

Referring to FIG. 30, the variable resistance memory device may include the first conductive pattern 104, a first cell structure 128d, the second conductive pattern 130, a second cell structure 148d and the third conductive pattern 150.

The first cell structure 128d may include the first selection pattern 110a, the first heating electrode 120d and the first variable resistance pattern 118d sequentially stacked. That is, the first variable resistance pattern 118d may be formed on and contacted with the first heating electrode 120d.

In an example embodiment of the present inventive concept, the first electrode 108a and the second electrode 112a may be further formed beneath a lower surface and on an upper surface, respectively, of the first selection pattern 110a.

The second cell structure 148d may include the second selection pattern 136, the second heating electrode 144d and the second variable resistance pattern 142d sequentially stacked. That is, the second variable resistance pattern 142d may contact an upper surface of the second heating electrode 144d.

In an example embodiment of the present inventive concept, a third electrode 134 and a fourth electrode 138 may be further formed beneath a lower surface and on an upper surface, respectively, of the second selection pattern 136.

A first contact area between the first variable resistance pattern 118d and the first heating electrode 120d and a second contact area between the second variable pattern 142d and the second heating electrode 144d may be different from each other. In an example embodiment of the present inventive concept, the second contact area may be smaller than the first contact area.

In an example embodiment of the present inventive concept, the first conductive pattern 104 may serve as a first word line, the third conductive pattern 150 may serve as a second word line, and the second conductive pattern 130 may serve as a common bit line.

In the variable resistance memory device, when a voltage is applied to the second conductive pattern 130 serving as the common bit line, a first current may flow into the first conductive pattern 104 through the first variable resistance pattern 118d, the first heating electrode 120d and the first selection pattern 110a so that data may be written in each of the first cell structures 128d. That is, the first current may flow in the fourth direction during an operation of the first cell structure 128d. When currents flow from the variable resistance pattern to the heating electrode in the cell structure, the direction of the currents is referred to as the fourth direction.

In the variable resistance memory device, when a voltage is applied to the second conductive pattern 130, a second current may flow into the third conductive pattern 130 through the second selection pattern 136, the second heating electrode 144d and the second variable resistance pattern 142d, so that data may be written in each of the second cell structures 148d. That is, the second current may flow in the third direction during an operation of the second cell structure 148d. When currents flow from the heating electrode to the variable resistance pattern in the cell structure, the direction of the currents is referred to as the third direction.

Even if the first and second cell structures 128d and 148d have substantially the same structure, reset currents of the first and second cell structures 128d and 148d may be different from each other. For example, the reset current of the second cell structure 148d may be higher than the reset current of the first cell structure 128d. However, in an example embodiment of the present inventive concept, the second contact area of the second cell structure 148d may be smaller than the first contact area of the first cell structure 128d, so that the reset current of the second cell structure 148d may be reduced. Thus, a difference between the reset currents of the first and second cell structures 128d and 148d may be reduced.

As the first and second contact areas may be different from each other, a difference between reset currents of the first and second cell structures 128d and 148d may be eliminated or minimized by adjusting the difference between the first and second contact areas. In an example embodiment of the present inventive concept, reset currents of the first and second cell structures 128d and 148d may be substantially the same as each other.

In an example embodiment of the present inventive concept, various types of memory devices, which may include first and second cell structures each including a selection pattern, a heating electrode and a variable resistance pattern sequentially stacked, may be provided. Also, in the memory devices, a first contact area between the variable resistance pattern and the heating electrode in the first cell structure may be greater than a second contact area between the variable resistance pattern and the heating electrode in the second cell structure.

In each of example embodiments of FIGS. 17, 20 to 22, each of the first and second cell structures may be modified to have a selection pattern, a heating electrode and a variable resistance pattern sequentially stacked. Also, the first contact area may be greater than a second contact area.

In an example embodiment of the present inventive concept, in the example embodiment of FIG. 30, the second conductive pattern may serve as a common word line, and the first and third conductive patterns may serve as a first and second bit lines, respectively. In this case, the first contact area may be smaller than the second contact area.

Figure 31:
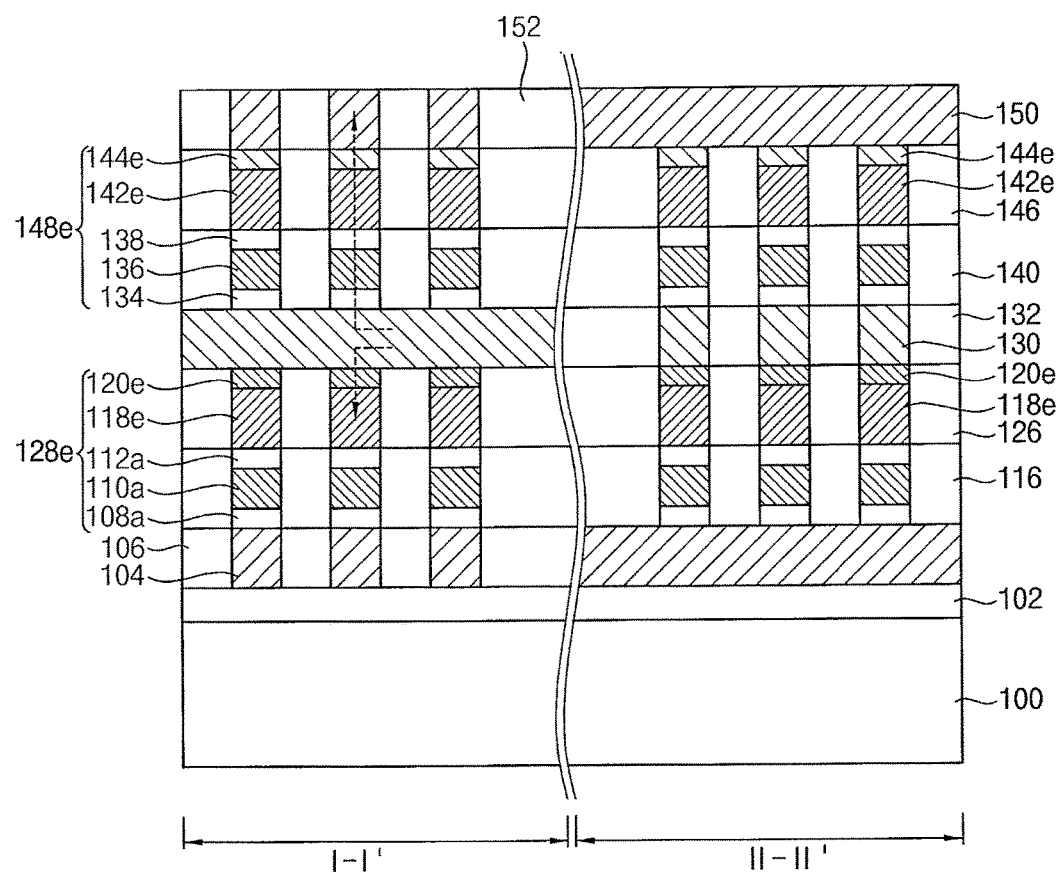
FIG. 31 is a cross-sectional view illustrating a variable resistance memory device in accordance with an example embodiment of the present inventive concept.

FIG. 31 is a cross-sectional view illustrating a variable resistance memory device in accordance with an example embodiment of the present inventive concept.

The variable resistance memory device of FIG. 31 may be substantially the same as or similar to the variable resistance memory device illustrated with reference to FIGS. 4A and 4B, except for first and second cell structures.

Referring to FIG. 31, the variable resistance memory device may include the first conductive pattern 104, a first cell structure 128e, the second conductive pattern 130, a second cell structure 148e and the third conductive pattern 150.

The first cell structure 128e may include the first selection pattern 110a, a first variable resistance pattern 118e and a first heating electrode 120e sequentially stacked. That is, the first heating electrode 120e may contact an upper surface of the first variable resistance pattern 118e.

In an example embodiment of the present inventive concept, the first electrode 108a and the second electrode 112a may be further formed beneath a lower surface and on an upper surface, respectively, of the first selection pattern 110a.

The second cell structure 148e may include the second selection pattern 136, a second variable resistance pattern 142e and a second heating electrode 144e sequentially stacked. That is, the second heating electrode 144e may contact an upper surface of the second variable resistance pattern 142e.

In an example embodiment of the present inventive concept, the third electrode 134 and the fourth electrode 138 may be further formed beneath a lower surface and on an upper surface, respectively, of the second selection pattern 136.

In an example embodiment of the present inventive concept, resistances of the first and the second heating electrodes 120e and 144e may be different from each other. In an example embodiment of the present inventive concept, the first heating electrode 120e may have a resistance higher than a resistance of the second heating electrodes 144e.

In an example embodiment of the present inventive concept, materials of the first and the second heating electrodes 120e and 144e may be different from each other. Alternatively, the first and second heating electrodes 120e and 144e may include substantially the same elements, however amounts of the elements included in each of the first and second heating electrodes 120e and 144e may be different from each other.

In an example embodiment of the present inventive concept, each of the first and second heating electrodes 120e and 144e may include, e.g., titanium nitride ($TiN_x$), titanium silicon nitride ($TiSiN_x$), tungsten nitride ($WN_x$), tungsten silicon nitride ($WSiN_x$), tantalum nitride ($TaN_x$), tantalum silicon nitride ($TaSiN_x$), zirconium nitride ($ZrN_x$), zirconium silicon nitride ($ZrSiN_x$), titanium aluminum nitride, carbon, etc. For example, the first heating electrode 120e may include titanium silicon nitride, and the second heating electrode 144e may also include titanium silicon nitride. For example, the first and second heating electrodes 120e and 144e may include titanium silicon nitride, and an amount of silicon included in the first heating electrode 120e may be greater than an amount of silicon included in the second heating electrode 144e.

In an example embodiment of the present inventive concept, the first and second cell structures 128e and 148e may have substantially the same multi-layer stacked structure. In an example embodiment of the present inventive concept, a width of the first cell structure 128e may be substantially the same as a width of the second cell structure 148e. Thus, the first contact area may be substantially the same as the second contact area.

In the variable resistance memory device, when a voltage is applied to the second conductive pattern 130 serving as the common bit line, a first current may flow into the first conductive pattern 104 through the first heating electrode 120e, the first variable resistance pattern 118e and the first selection pattern 110a so that data may be written in each of the first cell structures 128e. That is, the first current may flow in the third direction, i.e., a direction from a heating electrode toward a variable resistance pattern, during an operation of the first cell structure 128e.

In the variable resistance memory device, when a voltage is applied to the second conductive pattern 130 serving as the common bit line, a second current may flow into the third conductive pattern 150 through the second selection pattern 136, the second variable resistance pattern 142e and the second heating electrode 144e, so that data may be written in each of the second cell structures 148e. That is, the second current may flow in the fourth direction, i.e., a direction from a variable resistance pattern toward a heating electrode, during an operation of the second cell structure 148e.

Even if the first and second cell structures 128e and 148e have substantially the same structure, reset currents of the first and second cell structures 128e and 148e may be different from each other. For example, the reset current of the first cell structure 128e may be higher than the reset current of the second cell structure 148e. However, in an example embodiment of the present inventive concept, the first heating electrode 120e may have the resistance greater than the resistance of the second heating electrode 144e, so that the reset current of the first cell structure 128e may be reduced. Thus, a difference between reset currents of the first and second cell structures 128e and 148e may be eliminated or reduced by adjusting the difference between the resistance of the first heating electrode 120e and the resistance of the second heating electrode 144e. In an example embodiment of the present inventive concept, the reset currents of the first and second cell structures 128e and 148e may be substantially the same.

In an example embodiment of the present inventive concept, in the example embodiment of FIG. 31, the second conductive pattern may serve as a common word line, and the first and third conductive patterns may serve as a first and second bit lines, respectively. In this case, the first heating electrode 120e may have a resistance smaller than the resistance of the second heating electrode 144e.

Figure 32:
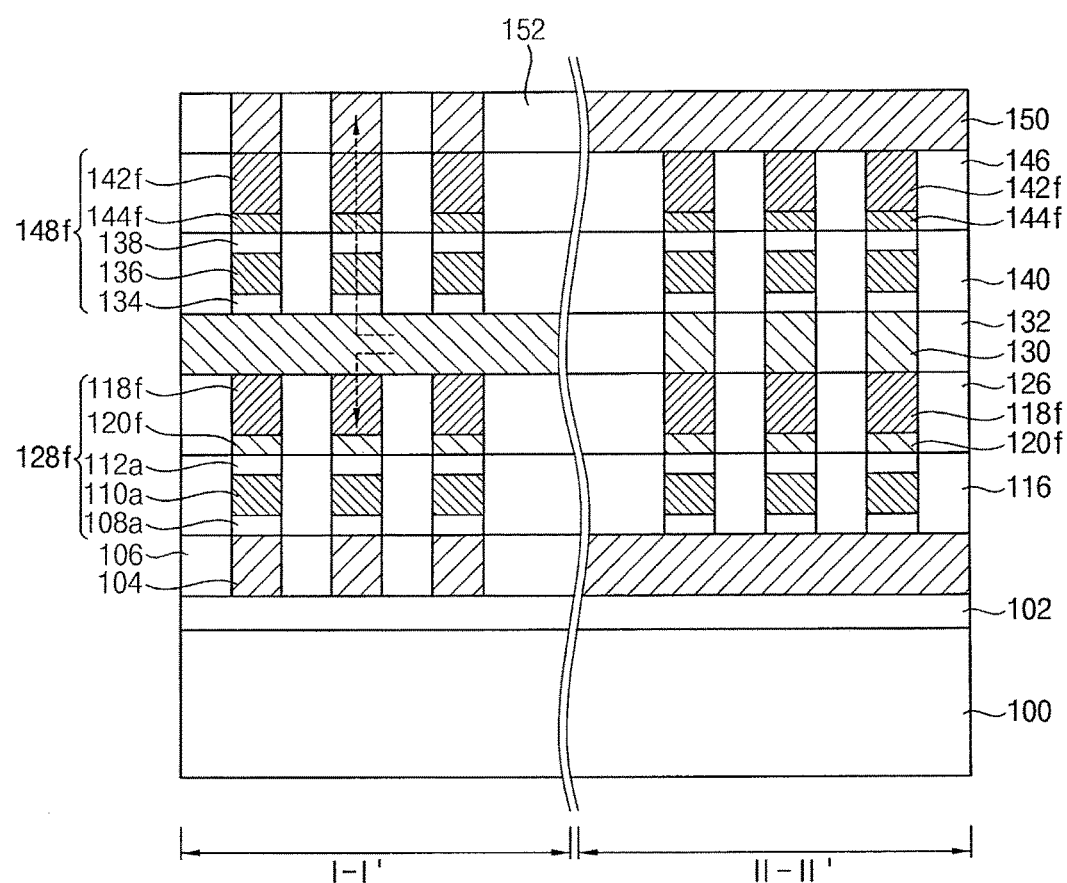
FIG. 32 is a cross-sectional view illustrating a variable resistance memory device in accordance with an example embodiment of the present inventive concept.

FIG. 32 is a cross-sectional view illustrating a variable resistance memory device in accordance with an example embodiment of the present inventive concept.

The variable resistance memory device of FIG. 32 may be substantially the same as or similar to the variable resistance memory device illustrated with reference to FIG. 31, except for first and second heating electrodes.

Referring to FIG. 32, the variable resistance memory device may include the first conductive pattern 104, a first cell structure 128f, the second conductive pattern 130, a second cell structure 148f and the third conductive pattern 150.

The first cell structure 128f may include the first selection pattern 110a, a first heating electrode 120f and a first variable resistance pattern 118f sequentially stacked. That is, the first variable resistance pattern 118f may contact an upper surface of the first heating electrode 120f.

The second cell structure 148f may include the second selection pattern 136, a second heating electrode 144f and a second variable resistance pattern 142f sequentially stacked. That is, the second variable resistance pattern 142f may contact an upper surface of the second heating electrode 144f.

In an example embodiment of the present inventive concept, resistances of the first and the second heating electrodes 120f and 144f may be different from each other. In an example embodiment of the present inventive concept, the second heating electrode 144f may have a resistance higher than a resistance of the first heating electrode 120f.

In an example embodiment of the present inventive concept, materials of the first and the second heating electrodes 120f and 144f may be different from each other. Alternatively, the first and second heating electrodes 120f and 144f may include substantially the same elements, however amounts of the elements included in each of the first and second heating electrodes 120f and 144f may be different from each other.

In an example embodiment of the present inventive concept, the first and second cell structures 128f and 148f may have substantially the same multi-layer stacked structure. In an example embodiment of the present inventive concept, a width of the first cell structure 128f may be substantially the same as a width of the second cell structure 148f. Thus, the first contact area may be substantially the same as the second contact area.

In the variable resistance memory device, a first current may flow in the fourth direction, i.e., a direction from a variable resistance pattern toward a heating electrode, during an operation of the first cell structure 128f. Also, a second current may flow in the third direction, i.e., a direction from a heating electrode toward a variable resistance pattern, during an operation of the second cell structure 148f.

Even if the first and second cell structures 128f and 148f have substantially the same structure, reset currents of the first and second cell structures 128f and 148f may be different from each other. For example, the reset current of the second cell structure 148f may be higher than the reset current of the first cell structure 128f. However, in an example embodiment of the present inventive concept, the second heating electrode 144f may have the resistance greater than the resistance of the first heating electrode 120f, so that the reset current of the second cell structure 148f may be reduced. Thus, a difference between the reset currents of the first and second cell structures 128f and 148f may be eliminated or reduced by adjusting the difference between the resistance of the first heating electrode 120f and the resistance of the second heating electrode 144f. In an example embodiment of the present inventive concept, the reset currents of the first and second cell structures 128f and 148f may be substantially the same.

In an example embodiment of the present inventive concept, in the example embodiment of FIG. 32, the second conductive pattern may serve as a common word line, and the first and third conductive patterns may serve as a first and second bit lines, respectively. In this case, the first heating electrode may have a resistance greater than the resistance of the second heating electrode.

Figure 33:
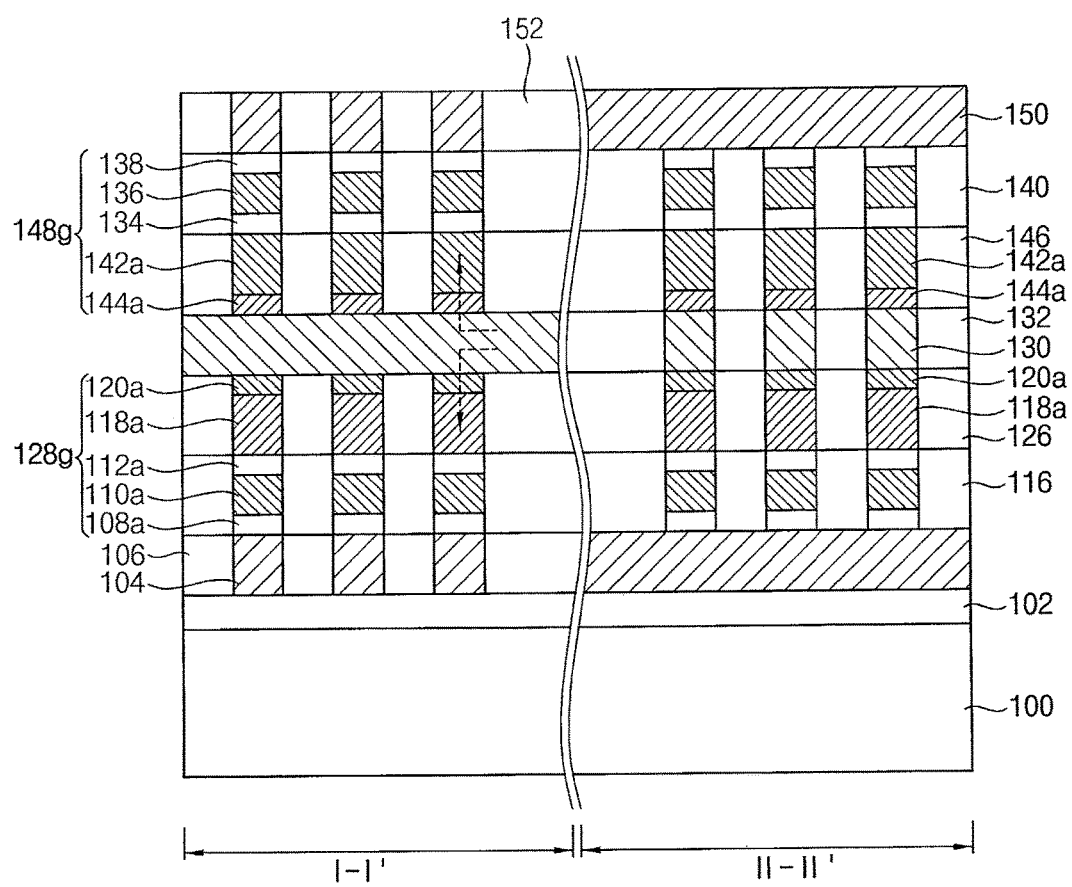
FIG. 33 is a cross-sectional view illustrating a variable resistance memory device in accordance with an example embodiment of the present inventive concept.

FIG. 33 is a cross-sectional view illustrating a variable resistance memory device in accordance with an example embodiment of the present inventive concept.

The variable resistance memory device of FIG. 33 may be substantially the same as or similar to the variable resistance memory device illustrated with reference to FIGS. 4A and 4B, except for first and second cell structures.

Referring to FIG. 33, the variable resistance memory device may include the first conductive pattern 104, a first cell structure 128g, the second conductive pattern 130, a second cell structure 148g and the third conductive pattern 150.

The first cell structure 128g may include the first selection pattern 110a, the first variable resistance pattern 118a and the first heating electrode 120a sequentially stacked. In an example embodiment of the present inventive concept, the first electrode 108a and the second electrode 112a may be further formed beneath a lower surface and on an upper surface, respectively, of the first selection pattern 110a.

The first and second cell structures 128g and 148g may be symmetric to each other with respect to the second conductive pattern 130. That is, the second cell structure 148g may include the second heating electrode 144a, the second variable resistance pattern 142a and the second selection pattern 136 sequentially stacked. In an example embodiment of the present inventive concept, the third electrode 134 and the fourth electrode 138 may be further formed beneath a lower surface and on an upper surface, respectively, of the second selection pattern 136.

The first contact area may be substantially the same as the second contact area.

In an example embodiment of the present inventive concept, the first conductive pattern 104 may serve as a first word line, the third conductive pattern 150 may serve as a second word line, and the second conductive pattern 130 may serve as a common bit line.

In the variable resistance memory device, when a voltage is applied to the second conductive pattern 130 serving as a common bit line, a first current may flow into the first conductive pattern 104 through the first heating electrode 120a, the first variable resistance pattern 118a and the first selection pattern 110a so that data may be written in each of the first cell structures 128g. That is, the first current may flow in the third direction, i.e., a direction from a heating electrode toward a variable resistance pattern, during an operation of the first cell structure 128g.

In the variable resistance memory device, when a voltage is applied to the second conductive pattern 130 serving as the common bit line, a second current may flow into the third conductive pattern 150 through the second heating electrode 144a, the second variable resistance pattern 142a and the second selection pattern 136, so that data may be written in each of the second cell structures 148g. That is, the second current may flow in the third direction, i.e., a direction from a heating electrode toward a variable resistance pattern, during an operation of the second cell structure 148g.

As described above, the first and second currents may flow in the same direction. Thus, the Peltier effect may not occur in the memory device, so that the reset currents of the first and second cell structures 128g and 148g may be substantially the same. The Peltier effect relates to an effect that junctions of dissimilar materials may be heated or cooled, depending upon the direction of an electric current passing across them. When the currents are flowing in the same direction, the effect of having different heating characteristics caused by different current directions may be removed, thus there is no difference on the Peltier effect between the two cell structures.

In an example embodiment of the present inventive concept, the first conductive pattern 104 and third conductive pattern 150 may serve as a first bit line and a second bit line, respectively, and the second conductive patterns 130 may serve as a common word line.

In the variable resistance memory device, when a voltage is applied to the first conductive pattern 104 serving as a first bit line, a first current may flow into the second conductive pattern 130 through the first selection pattern 110a, the first variable resistance pattern 118a and the first heating electrode 120a so that data may be written in each of the first cell structures 128g. That is, the first current may flow in the fourth direction, i.e., a direction from a variable resistance pattern toward a heating electrode, during an operation of the first cell structure 128g.

In the variable resistance memory device, when a voltage is applied to the third conductive pattern 150 serving as a second bit line, a second current may flow into the second conductive pattern 130 through the second selection pattern 136, the second variable resistance pattern 142a and the second heating electrode 144a, so that data may be written in each of the second cell structures 148g. That is, the second current may flow in the fourth direction, i.e., a direction from a variable resistance pattern toward a heating electrode, during an operation of the second cell structure 148g.

As described above, when the second conductive pattern 130 serves as the common word line, the first and second currents may flow in the same direction. Thus, the reset currents of the first and second cell structures 128g and 148g may be substantially the same.

Figure 34:
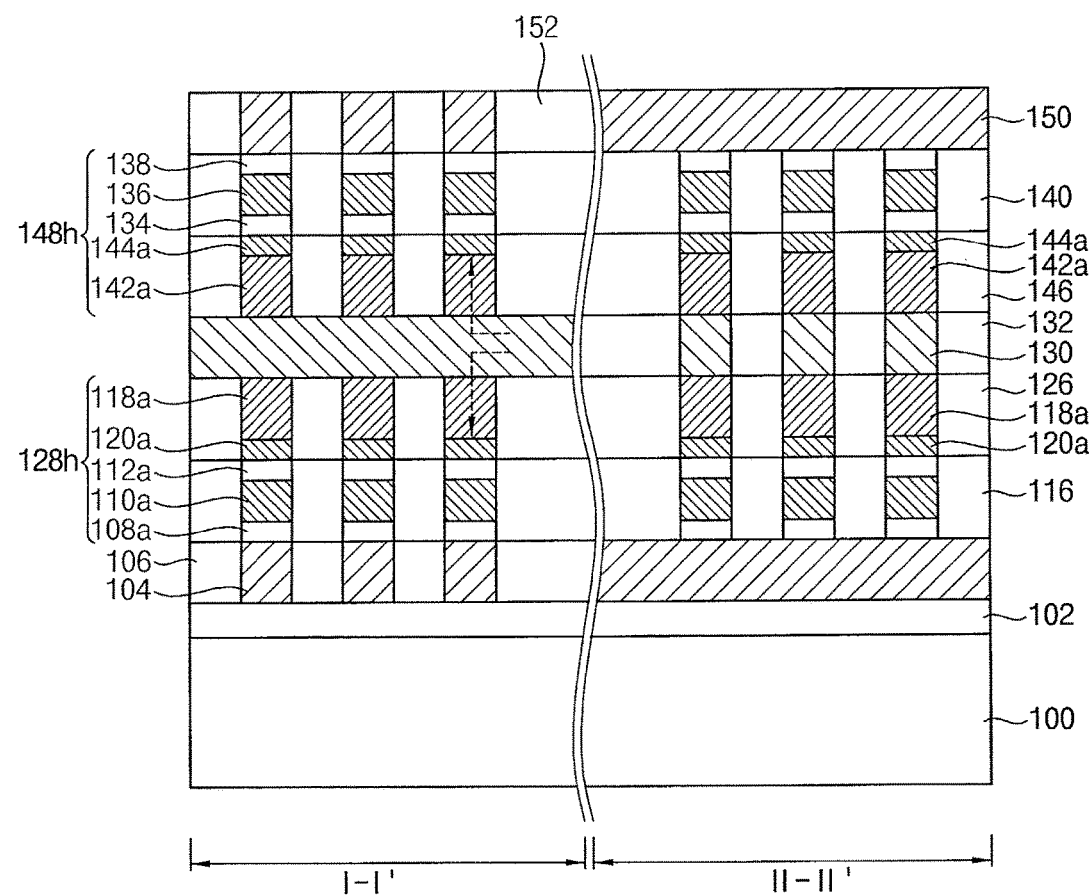
FIG. 34 is a cross-sectional view illustrating a variable resistance memory device in accordance with an example embodiment of the present inventive concept.

FIG. 34 is a cross-sectional view illustrating a variable resistance memory device in accordance with an example embodiment of the present inventive concept.

The variable resistance memory device of FIG. 34 may be substantially the same as or similar to the variable resistance memory device illustrated with reference to FIGS. 4A and 4B, except for first and second cell structures.

Referring to FIG. 34, the variable resistance memory device may include the first conductive pattern 104, a first cell structure 128h, the second conductive pattern 130, a second cell structure 148h and the third conductive pattern 150.

The first cell structure 128h may include the first selection pattern 110a, the first heating electrode 120a and the first variable resistance pattern 118a sequentially stacked. In an example embodiment of the present inventive concept, the first electrode 108a and the second electrode 112a may be further formed beneath a lower surface and on an upper surface, respectively, of the first selection pattern 110a.

The first and second cell structures 128h and 148h may be symmetric to each other with respect to the second conductive pattern 130. That is, the second cell structure 148h may include the second variable resistance pattern 142a, the second heating electrode 144a and the second selection pattern 136 sequentially stacked. In an example embodiment of the present inventive concept, the third electrode 134 and the fourth electrode 138 may be further formed beneath a lower surface and on an upper surface, respectively, of the second selection pattern 136.

The first contact area may be substantially the same as the second contact area.

In an example embodiment of the present inventive concept, the first conductive pattern 104 may serve as a first word line, the third conductive pattern 150 may serve as a second word line, and the second conductive pattern 130 may serve as a common bit line.

In the variable resistance memory device, a first current may flow in the fourth direction, i.e., a direction from a variable resistance pattern toward a heating electrode, during an operation of the first cell structure 128h. Also, a second current may flow in the fourth direction, i.e., a direction from a variable resistance pattern toward a heating electrode, during an operation of the second cell structure 148h.

As described above, the first and second currents may flow in the same direction.

Thus, the Peltier effect may not occur in the memory device, so that the reset currents of the first and second cell structures 128h and 148h may be substantially the same.

In an example embodiment of the present inventive concept, the first conductive pattern and third conductive pattern may serve as a first bit line and a second bit line, respectively, and the second conductive patterns may serve as a common word line. In this case, the first and second currents may flow in same direction, that is, the third direction, i.e., a direction from a heating electrode toward a variable resistance pattern. Thus, the reset currents of the first and second cell structures 128h and 148h may be substantially the same.

In an example embodiment of the present inventive concept, various types of memory devices, which may include first and second cell structures being symmetric to each other with respect to the second conductive pattern, may be provided. In the provided memory device, electrical characteristics of the first and second cell structures may be substantially the same.

Figure 35:
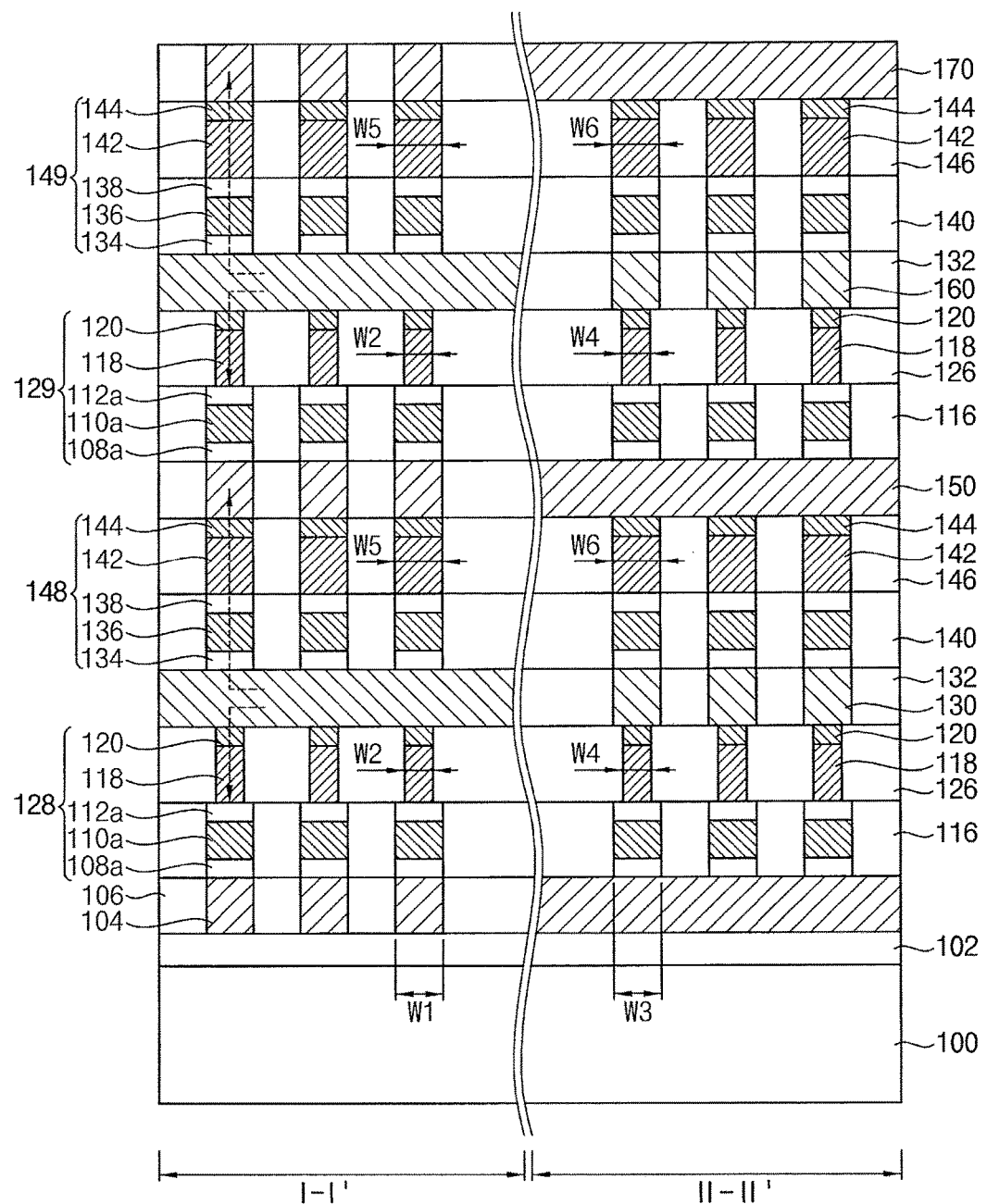
FIG. 35 is a cross-sectional view illustrating a variable resistance memory device in accordance with an example embodiment of the present inventive concept.

FIG. 35 is a cross-sectional view illustrating a variable resistance memory device in accordance with an example embodiment of the present inventive concept.

Referring to FIG. 35, a plurality of conductive patterns and a plurality of cell structures may be further formed on the memory device of FIGS. 4A and 4B. The conductive patterns may be disposed to cross each other for each adjacent ones in a direction perpendicular to the first and second directions when they are stacked vertically from the substrate, and the cell structures may be formed at crosspoints of the conductive patterns.

In an example embodiment of the present inventive concept, a fourth conductive pattern 160 and a fifth conductive pattern 170 may be further formed over the third conductive pattern 150. The fourth conductive pattern 160 may be overlapped with the second conductive pattern 130, and the fifth conductive pattern 170 may be overlapped with the third conductive pattern 150.

A third cell structure 129 may be formed at a cross-point of the third and fourth conductive patterns 150 and 160. The third cell structure 129 may be substantially the same as the first cell structure 128. That is, the third cell structure 129 may include the first selection pattern 110a, the first variable resistance pattern 118 and the first heating electrode 120 sequentially stacked.

A fourth cell structure 149 may be formed at a cross-point of the fourth and fifth conductive patterns 160 and 170. The fourth cell structure 149 may be substantially the same as the second cell structure 148. That is, the fourth cell structure 149 may include the second selection pattern 136, the second variable resistance pattern 142 and the second heating electrode 144 sequentially stacked.

A first contact area between the first variable resistance pattern 118 and the first heating electrode 120 in each of the first and third cell structures 128 and 129 may be smaller than a second contact area between the second variable resistance pattern 142 and the second heating electrode 144 in each of the second and fourth cell structures 148 and 149.

As described above, the memory device may have a plurality of memory cells vertically stacked. For example, the first and second cell structures may be further formed on each of the memory devices in accordance with the example embodiments described above. That is, a plurality of conductive patterns (e.g., fourth, fifth, sixth ... etc. conductive patterns) may be formed over the third conductive pattern of each of the memory devices, and the first and second cell structures may be formed at cross-points of the conductive patterns. The first and second cell structures may be alternately formed in a vertical direction. For example, the first cell structure may be formed at each of odd levels between conductive patterns, and the second cell structure may be formed at each of even levels between the conductive patterns.

Although a few specific example embodiments of the present inventive concept have been described, those skilled in the art will readily appreciate that many modifications are possible in the example embodiments without materially departing from the novel teachings of the present inventive concept. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
    a plurality of first conductive patterns on a substrate, each of the plurality of first conductive patterns extending in a first direction parallel to a top surface of the substrate;
    a first selection pattern on each of the plurality of first conductive patterns;
    a first structure on the first selection pattern, the first structure including a first variable resistance pattern and a first heating electrode, and the first variable resistance pattern and the first heating electrode contacting each other to have a first contact area therebetween;
    a plurality of second conductive patterns on the first structures, each of the plurality of second conductive patterns extending in a second direction parallel to the top surface of the substrate, the second direction crossing the first direction;
    a second selection pattern on each of the plurality of second conductive patterns;
    a second structure on the second selection pattern, the second structure including a second variable resistance pattern and a second heating electrode, the second variable resistance pattern and the second heating electrode contacting each other to have a second contact area therebetween, and the second contact area being different from the first contact area; and
    a plurality of third conductive patterns on the second structures,
    wherein the first contact area and the second contact area are separated by each of the plurality of second conductive patterns in a third direction perpendicular to the first and second directions.

2. The semiconductor device of claim 1, wherein the second conductive pattern serves as a common bit line, the first variable resistance pattern and the first heating electrode are sequentially stacked on the first selection pattern, and the second variable resistance pattern and the second heating electrode are sequentially stacked on the second selection pattern.

3. The semiconductor device of claim 2, wherein the first contact area is smaller than the second contact area.

4. The semiconductor device of claim 2, wherein a width of the first structure is smaller than a width of the second structure.

5. The semiconductor device of claim 2, wherein a sidewall of the first structure has a slope such that the first structure has a gradually decreasing width from a bottom toward a top thereof.

6. The semiconductor device of claim 1, wherein the second conductive pattern serves as a common bit line, the first heating electrode and the first variable resistance pattern are sequentially stacked on the first selection pattern, and the second heating electrode and the second variable resistance pattern are sequentially stacked on the second selection pattern.

7. The semiconductor device of claim 6, wherein the second contact area is smaller than the first contact area.

8. The semiconductor device of claim 1, wherein the first selection pattern has a structure substantially the same as a structure of the second selection pattern.

9. The semiconductor device of claim 1, wherein each of the first and second selection patterns includes OTS material including at least one of germanium (Ge), silicon (Si), indium (In), tin (Sn), arsenic (As) and tellurium (Te).

10. The semiconductor device of claim 1, further comprising a first electrode, a second electrode, a third electrode and a fourth electrode,
    wherein the first and second electrodes are formed beneath a lower surface and on an upper surface, respectively, of the first selection pattern, and the third and fourth electrodes are formed beneath a lower surface and on an upper surface, respectively, of the second selection pattern.

11. The semiconductor device of claim 10, wherein each of the first and second electrodes has a resistance lower than a resistance of the first heating electrode, and each of the third and fourth electrodes has a resistance lower than a resistance of the second heating electrode.

12. The semiconductor device of claim 1, further comprising a plurality of conductive patterns and a plurality of first and second cell structures alternatively stacked on the third conductive pattern,
    wherein the plurality of conductive patterns cross each other in a plan view,
    each of the plurality of first cell structures includes the first selection pattern, the first variable resistance pattern and the first heating electrode sequentially stacked, and is formed at each of odd levels between the conductive patterns, and
    each of the plurality of second cell structures includes the second selection pattern, the second variable resistance pattern and the second heating electrode sequentially stacked, and is formed at each of even levels between the conductive patterns.

13. A semiconductor device comprising:
a plurality of first conductive patterns on a substrate, each of the plurality of first conductive patterns extending in a first direction parallel to a top surface of the substrate;
a first selection pattern on each of the plurality of first conductive patterns;
a first structure on the first selection pattern, the first structure including a first variable resistance pattern and a first heating electrode;
a plurality of second conductive patterns on the first structures, each of the plurality of second conductive patterns extending in a second direction parallel to the top surface of the substrate, the second direction crossing the first direction;
a second selection pattern on each of the plurality of second conductive patterns;
a second structure on the second selection pattern, the second structure including a second variable resistance pattern and a second heating electrode, and the second heating electrode having a second resistance different from a first resistance of the first heating electrode; and
a plurality of third conductive patterns on the second structures,
wherein the first heating electrode having the first resistance and the second heating electrode having the second resistance are separated by each of the plurality of second conductive patterns in a third direction perpendicular to the first and second directions.

14. The semiconductor device of claim 13, wherein the second conductive pattern serves as a common bit line, the first variable resistance pattern and the first heating electrode are sequentially stacked on the first selection pattern, and the second variable resistance pattern and the second heating electrode are sequentially stacked on the second selection pattern.

15. The semiconductor device of claim 14, wherein the first resistance is higher than the second resistance.

16. The semiconductor device of claim 13, wherein the second conductive pattern serves as a common bit line, the first heating electrode and the first variable resistance pattern are sequentially stacked on the first selection pattern, and the second heating electrode and the second variable resistance pattern are sequentially stacked on the second selection pattern.

17. The semiconductor device of claim 16, wherein the second resistance is higher than the first resistance.

18. A semiconductor device comprising:
a plurality of first conductive patterns on a substrate, each of the plurality of first conductive patterns extending in a first direction;
a first selection pattern on each of the plurality of first conductive patterns;
a first structure on the first selection pattern, the first structure including a first variable resistance pattern and a first heating electrode contacting the first variable resistance pattern;
a plurality of second conductive patterns on the first structures, each of the plurality of second conductive patterns extending in a second direction crossing the first direction;
a second selection pattern on each of the plurality of second conductive patterns;
a second structure on the second selection pattern, the second structure including a second variable resistance pattern and a second heating electrode contacting the second variable resistance pattern; and
a plurality of third conductive patterns on the second structures,
wherein the first structure includes a first spacer having a first thickness and surrounding sidewalls of the first variable resistance pattern and the first heating electrode, the second structure includes a second spacer having a second thickness different from the first thickness and surrounding sidewalls of the second variable resistance pattern and the second heating electrode, or both the first structure includes the first spacer and the second structure includes the second spacer, and
a width of the first structure is substantially the same as a width of the second structure.

19. The semiconductor device of claim 18, wherein the first structure includes the first spacer and the second structure does not include the second spacer, the second conductive pattern serves as a common bit line, the first variable resistance pattern and the first heating electrode are sequentially stacked on the first selection pattern, and the second variable resistance pattern and the second heating electrode are sequentially stacked on the second selection pattern.

20. The semiconductor device of claim 18, wherein the first structure includes the first spacer having the first thickness and the second structure includes the second spacer having the second thickness smaller than the first thickness, the second conductive pattern serves as a common bit line, the first variable resistance pattern and the first heating electrode are sequentially stacked on the first selection pattern, and the second variable resistance pattern and the second heating electrode are sequentially stacked on the second selection pattern.

* * * * *